US010672670B2

(12) United States Patent
Bao et al.

(10) Patent No.: US 10,672,670 B2
(45) Date of Patent: Jun. 2, 2020

(54) REPLACEMENT METAL GATE PROCESS FOR VERTICAL TRANSPORT FIELD-EFFECT TRANSISTORS WITH MULTIPLE THRESHOLD VOLTAGES

(71) Applicant: International Business Machines Corporation, Armonk, NY (US)

(72) Inventors: Ruqiang Bao, Niskayuna, NY (US); Hemanth Jagannathan, Niskayuna, NY (US); Brent A. Anderson, Jericho, VT (US); ChoongHyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/106,396

(22) Filed: Aug. 21, 2018

(65) Prior Publication Data
US 2020/0066603 A1 Feb. 27, 2020

(51) Int. Cl.
*H01L 21/8238* (2006.01)
*H01L 21/28* (2006.01)
(Continued)

(52) U.S. Cl.
CPC ........... *H01L 21/823885* (2013.01); *H01L 21/28088* (2013.01); *H01L 21/823814* (2013.01);
(Continued)

(58) Field of Classification Search
CPC ........... H01L 29/7827; H01L 29/42376; H01L 29/66545; H01L 27/092; H01L 21/823885
See application file for complete search history.

(56) References Cited

U.S. PATENT DOCUMENTS 6,770,534 B2 8/2004 Cho et al.
6,773,994 B2 8/2004 Chittipeddi et al.
(Continued)

FOREIGN PATENT DOCUMENTS

CN 103972067 A 1/2014
CN 105261645 A 7/2014
WO PCT/IB2018/060735 5/2019

OTHER PUBLICATIONS

S. Yamaguchi et al., "Effective Work-Function Control Technique Applicable to p-Type FinFET High-k/Metal Devices," Gate Microelectronics Reliability, May 2017, pp. 80-84, vol. 72.
(Continued)

*Primary Examiner* — Mark W Tornow
(74) *Attorney, Agent, or Firm* — Vazken Alexanian; Ryan, Mason & Lewis, LLP

(57) ABSTRACT

A method of forming a semiconductor structure includes forming a plurality of fins over a top surface of a bottom source/drain region disposed over a top surface of a substrate, the fins providing vertical transport channels for a plurality of vertical transport field-effect transistors. The method also includes forming a first gate conductor surrounding a first one of an adjacent pair of the plurality of fins providing a first vertical transport channel for a first vertical transport field-effect transistor, forming a second gate conductor surrounding a second one of the adjacent pair of the plurality of fins providing a second vertical transport channel for a second vertical transport field-effect transistor, and forming at least one shared gate contact to the first gate conductor and the second gate conductor, the at least one shared gate contact being formed at first ends of the adjacent pair of the plurality of fins.

10 Claims, 25 Drawing Sheets

(51) Int. Cl.

| | | |
|---|---|---|
| *H01L 29/78* | (2006.01) | |
| *H01L 29/66* | (2006.01) | |
| *H01L 23/535* | (2006.01) | |
| *H01L 27/092* | (2006.01) | |
| *H01L 29/08* | (2006.01) | |
| *H01L 29/49* | (2006.01) | |

(52) U.S. Cl.
CPC ............ *H01L 21/823842* (2013.01); *H01L 21/823871* (2013.01); *H01L 23/535* (2013.01); *H01L 27/092* (2013.01); *H01L 29/0847* (2013.01); *H01L 29/4966* (2013.01); *H01L 29/66545* (2013.01); *H01L 29/66666* (2013.01); *H01L 29/7827* (2013.01)

(56) References Cited

U.S. PATENT DOCUMENTS

| | | | |
|---|---|---|---|
| 7,683,428 B2 * | 3/2010 | Chidambarrao | H01L 29/66787 257/302 |
| 8,274,110 B2 * | 9/2012 | Sandhu | H01L 27/2463 257/329 |
| 8,455,932 B2 | 6/2013 | Khakifirooz et al. | |
| 8,865,581 B2 | 10/2014 | Clark | |
| 8,877,575 B2 | 11/2014 | Fumitake | |
| 9,048,254 B2 | 6/2015 | Chen et al. | |
| 9,087,897 B1 * | 7/2015 | Anderson | H01L 29/7827 |
| 9,136,178 B2 | 9/2015 | Li et al. | |
| 9,209,278 B2 | 12/2015 | Tang et al. | |
| 9,437,503 B1 * | 9/2016 | Mallela | H01L 21/8238 |
| 9,502,566 B2 | 11/2016 | Fenouillet-Beranger et al. | |
| 9,530,863 B1 | 12/2016 | Zhang et al. | |
| 9,530,866 B1 * | 12/2016 | Zhang | H01L 29/66666 |
| 9,536,793 B1 | 1/2017 | Zhang et al. | |
| 9,613,868 B2 | 4/2017 | Yu | |
| 9,640,636 B1 | 5/2017 | Bentley et al. | |
| 9,653,465 B1 | 5/2017 | Balakrishnan et al. | |
| 9,773,708 B1 | 9/2017 | Zhang et al. | |
| 9,780,208 B1 | 10/2017 | Xie et al. | |
| 9,786,788 B1 * | 10/2017 | Anderson | H01L 29/78642 |
| 9,799,751 B1 | 10/2017 | Zhang et al. | |
| 9,859,421 B1 | 1/2018 | Robison et al. | |
| 9,882,047 B2 | 1/2018 | Leobandung | |
| 9,911,738 B1 | 3/2018 | Niimi et al. | |
| 9,935,199 B2 | 4/2018 | Ching et al. | |
| 10,014,370 B1 | 7/2018 | Xie et al. | |
| 2006/0166429 A1 | 7/2006 | Chaudhry et al. | |
| 2006/0261406 A1 | 11/2006 | Chen | |
| 2016/0240626 A1 * | 8/2016 | Chang | H01L 29/42392 |
| 2017/0025412 A1 * | 1/2017 | Jun | H01L 21/823487 |
| 2017/0053913 A1 | 2/2017 | Min et al. | |
| 2017/0162446 A1 | 6/2017 | Balakrishnan et al. | |
| 2017/0179282 A1 | 6/2017 | Balakrishnan et al. | |
| 2017/0194155 A1 * | 7/2017 | Anderson | H01L 21/28518 |
| 2017/0288056 A1 | 10/2017 | Balakrishnan et al. | |
| 2018/0006118 A1 | 1/2018 | Mallela et al. | |
| 2018/0019337 A1 | 1/2018 | Xie et al. | |
| 2018/0053847 A1 | 2/2018 | Balakrishnan et al. | |
| 2019/0172830 A1 | 6/2019 | Ok et al. | |

OTHER PUBLICATIONS

A.P. Jacob et al., "Scaling Challenges for Advanced CMOS Devices," International Journal of High Speed Electronics and Systems, 2017, 76 pages, vol. 26, No. 1.

Disclosed Anonymously, "Method and Structure of Forming VFET Bottom Spacer and Replacement Gate," ip.com, ip.com No. IPCOM000250753D, Aug. 30, 2017, 9 pages.

List of IBM Patents or Patent Applications Treated as Related.

* cited by examiner

200

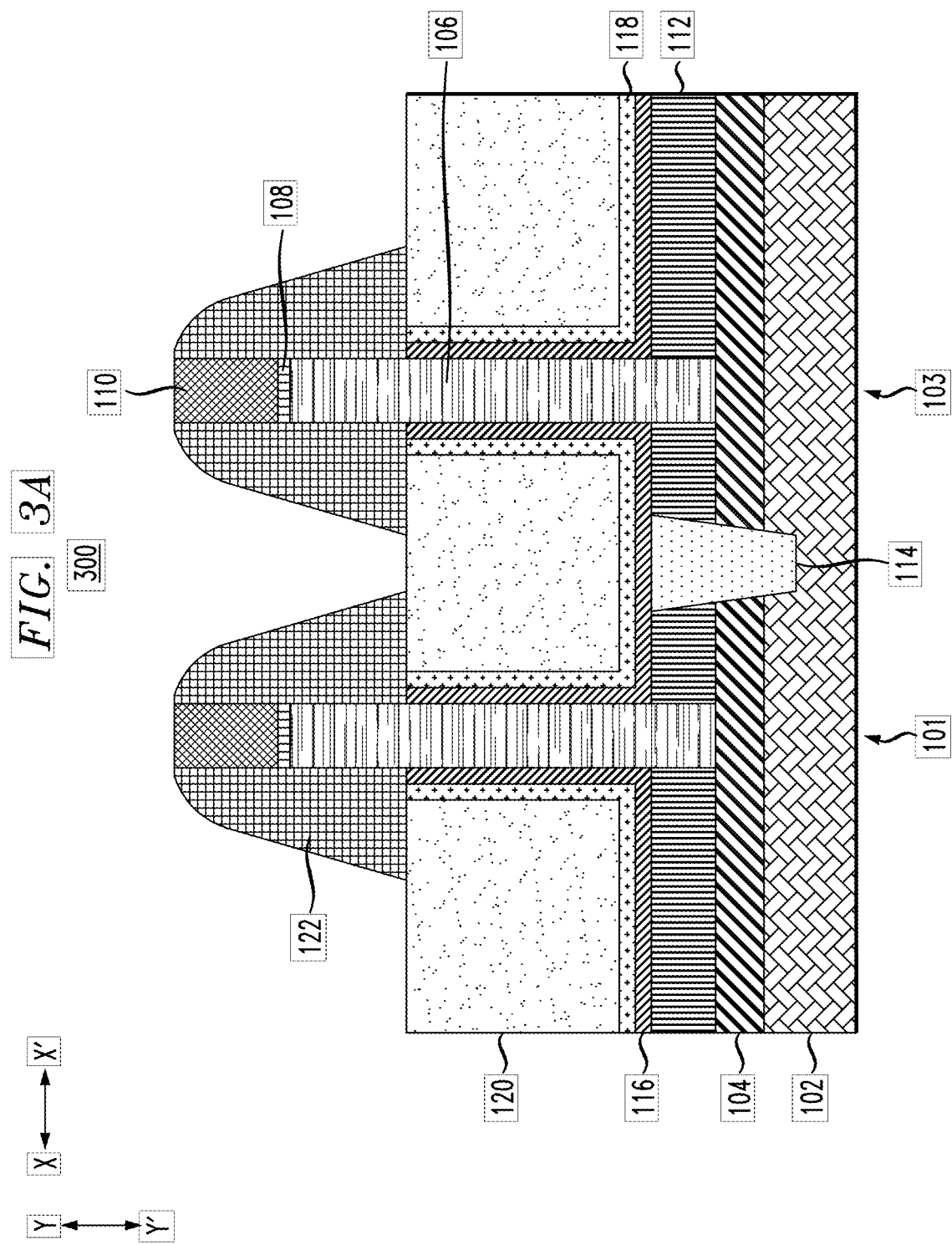

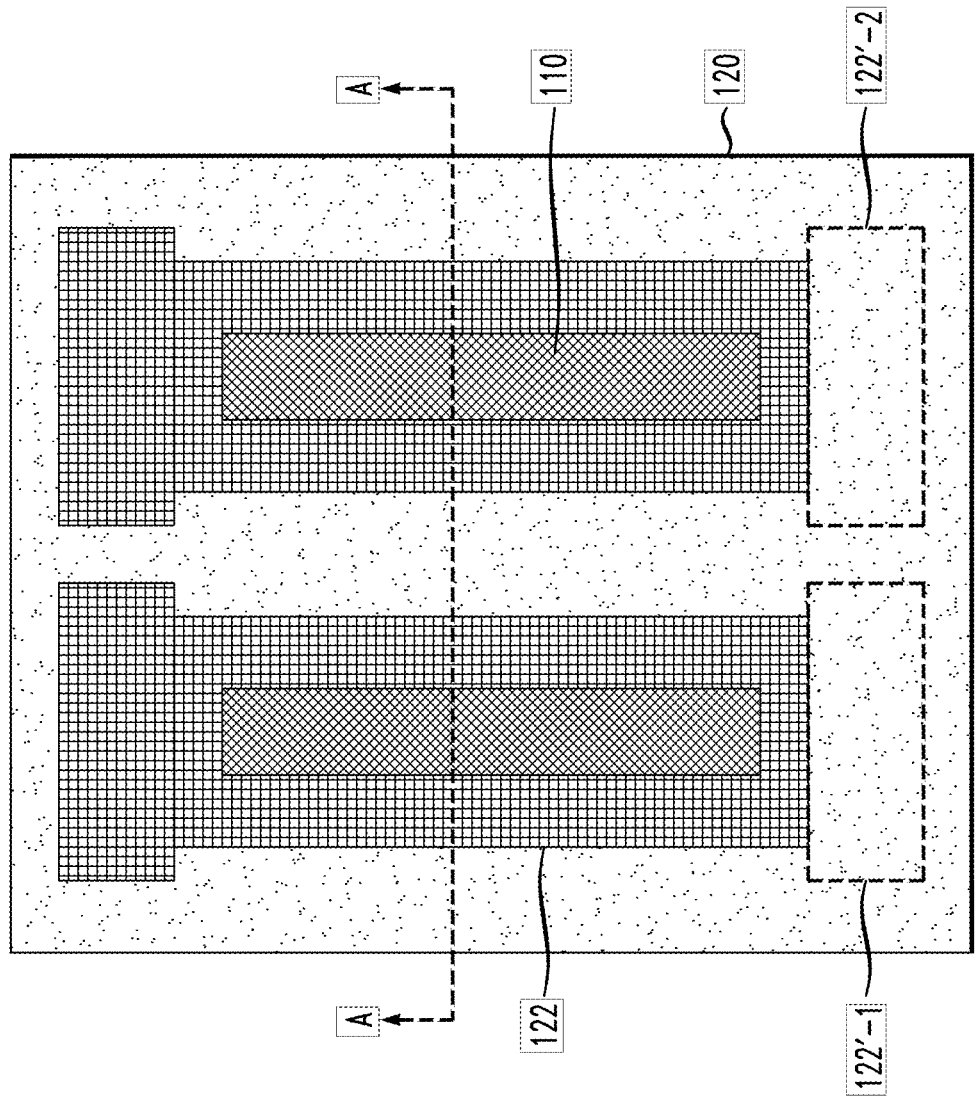

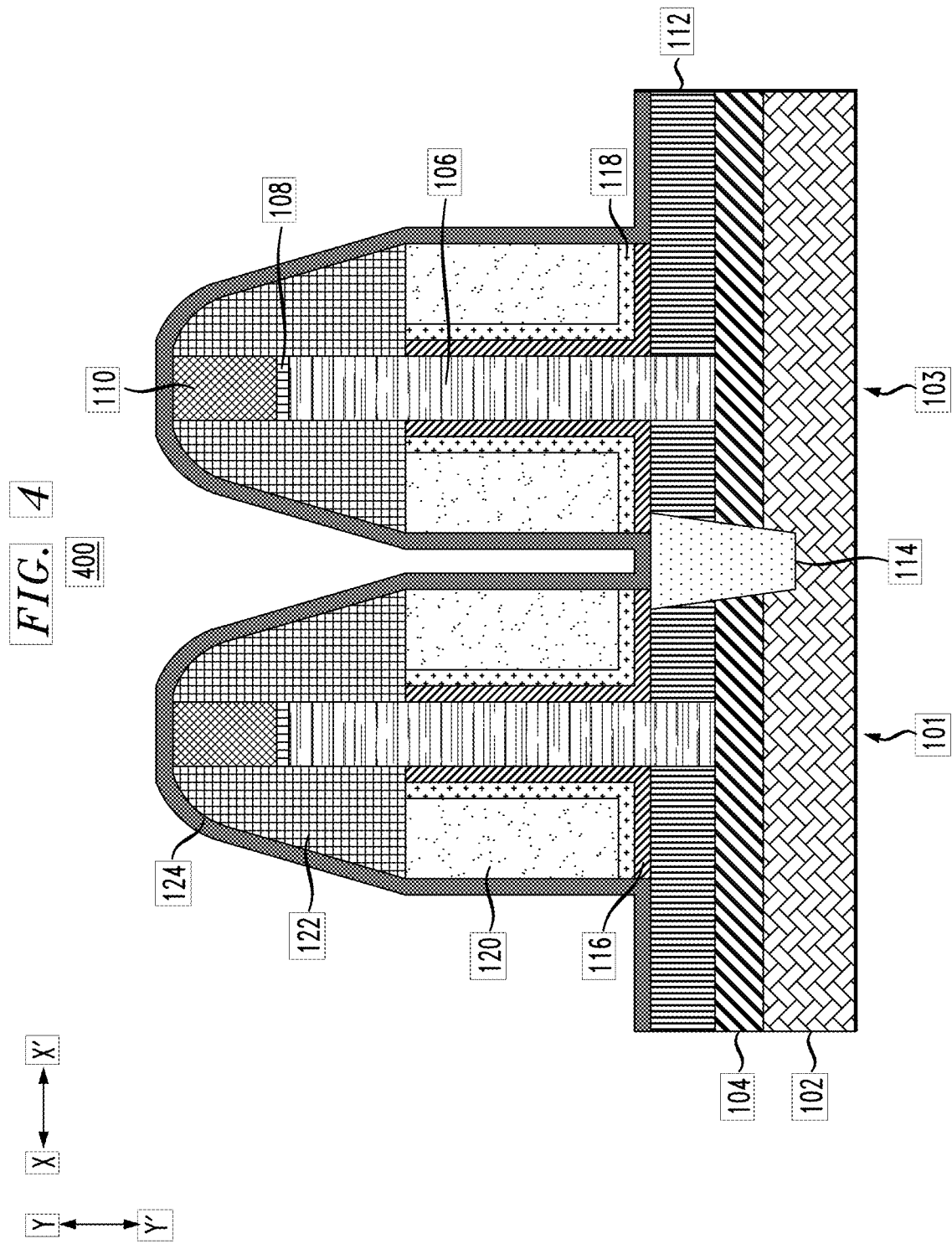

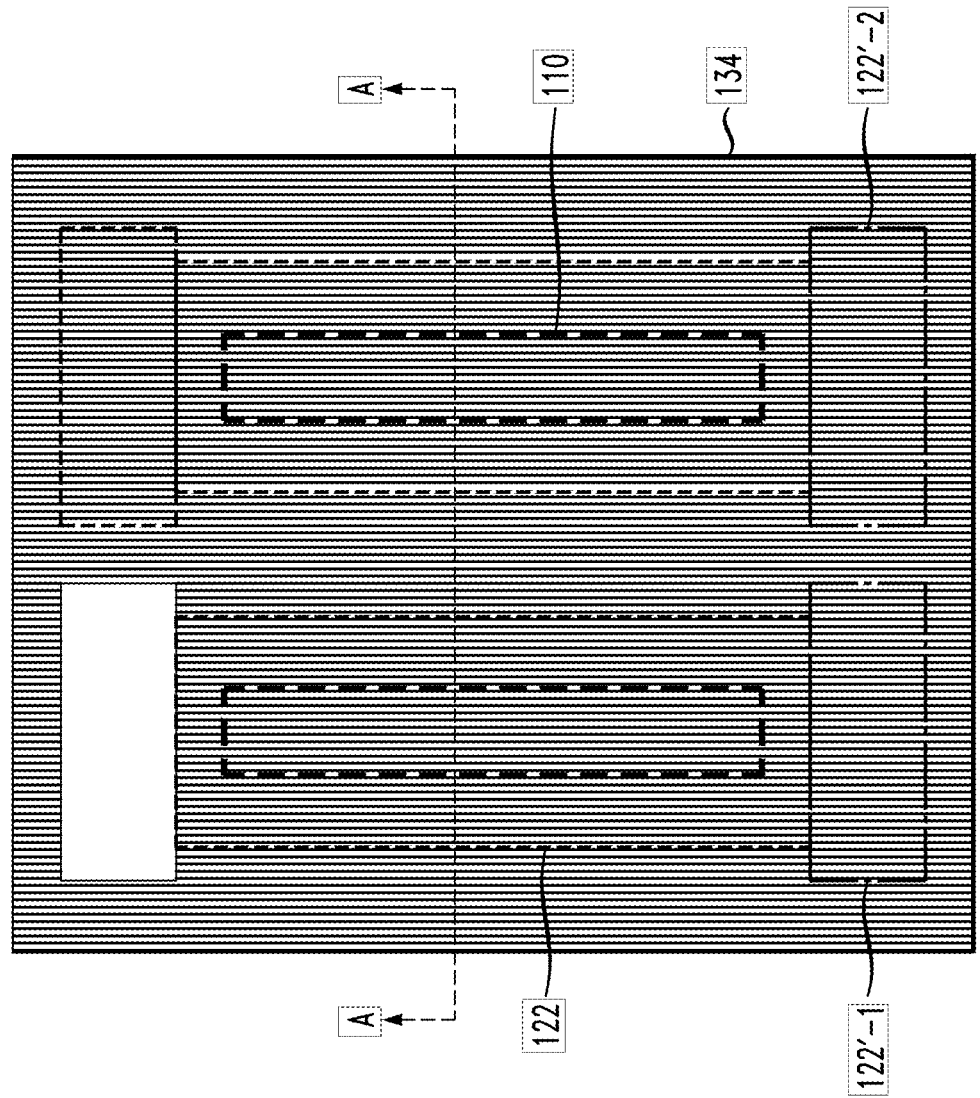

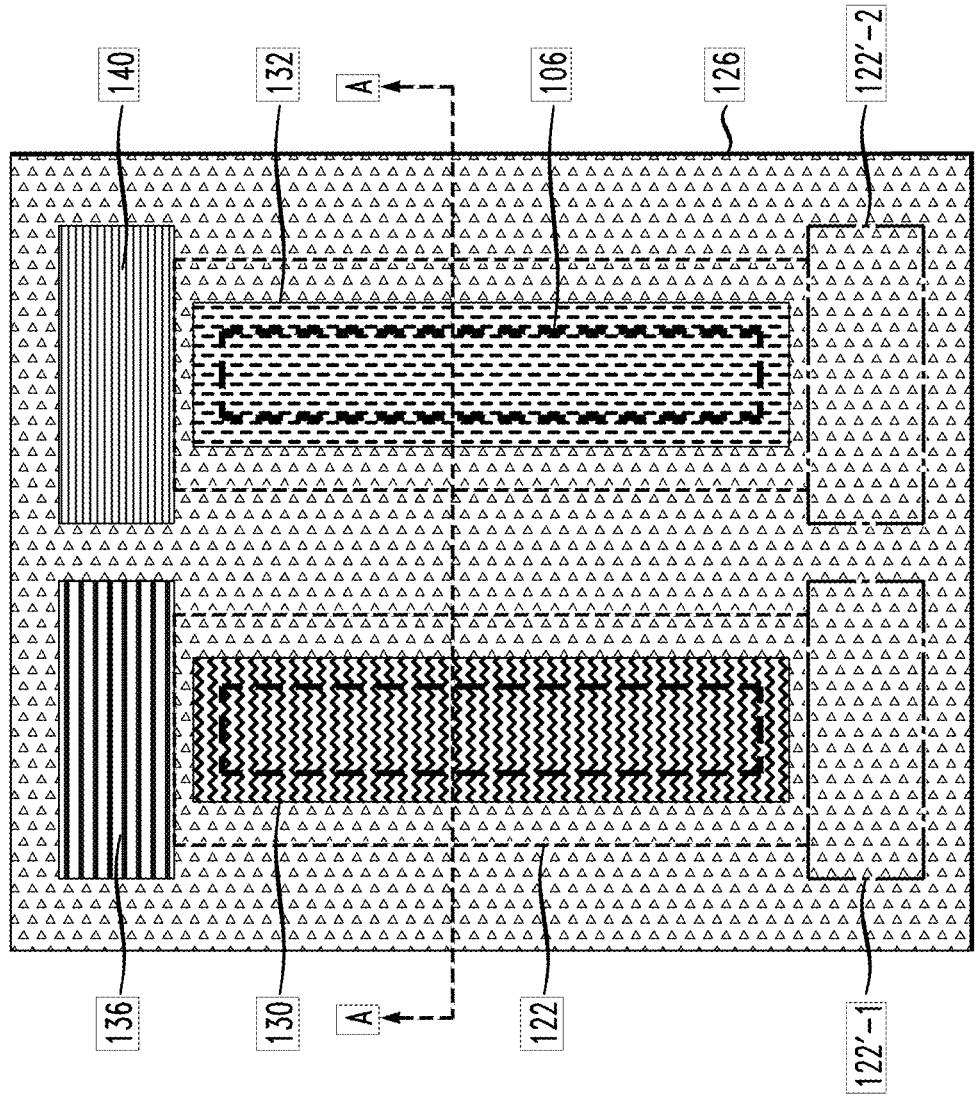

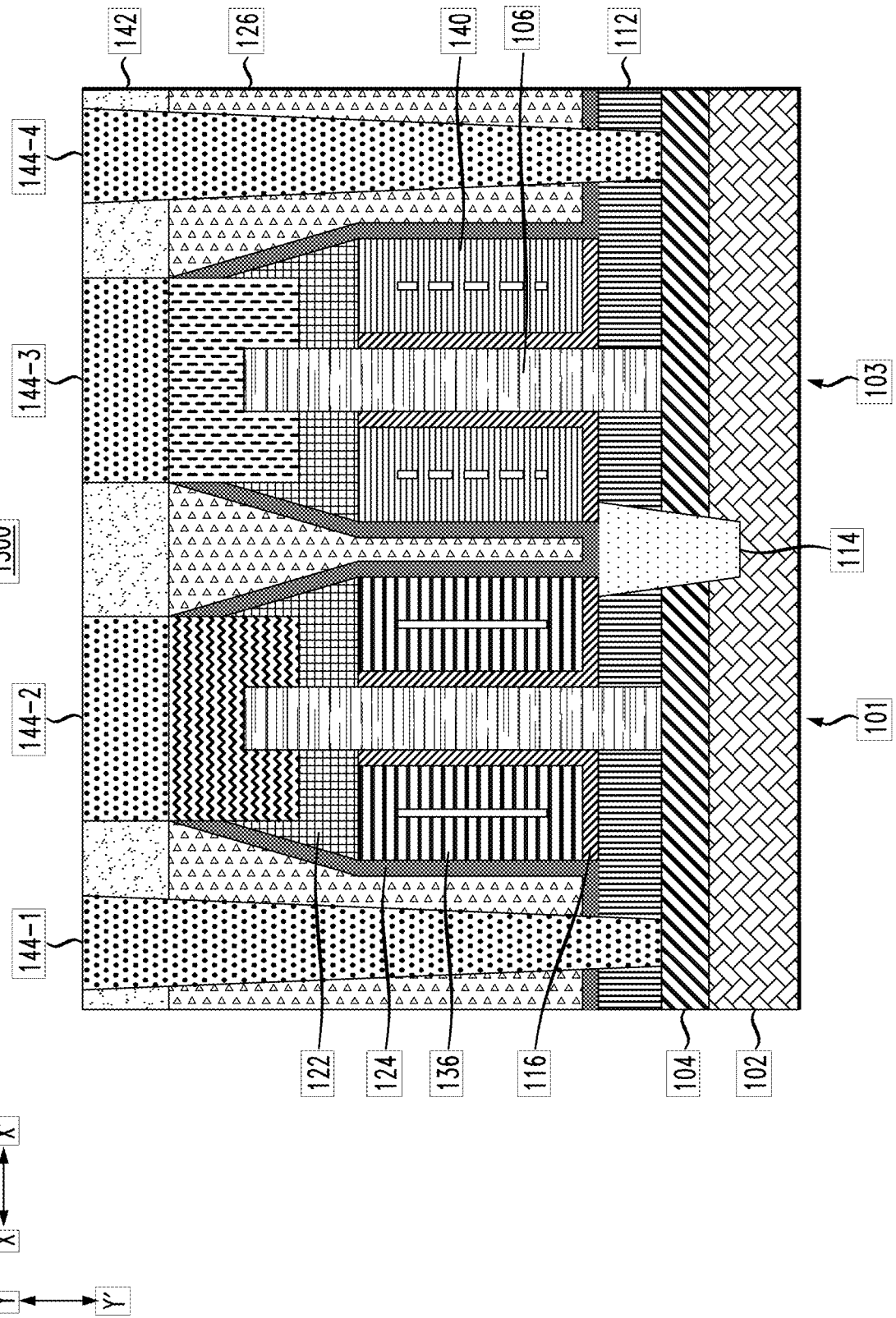

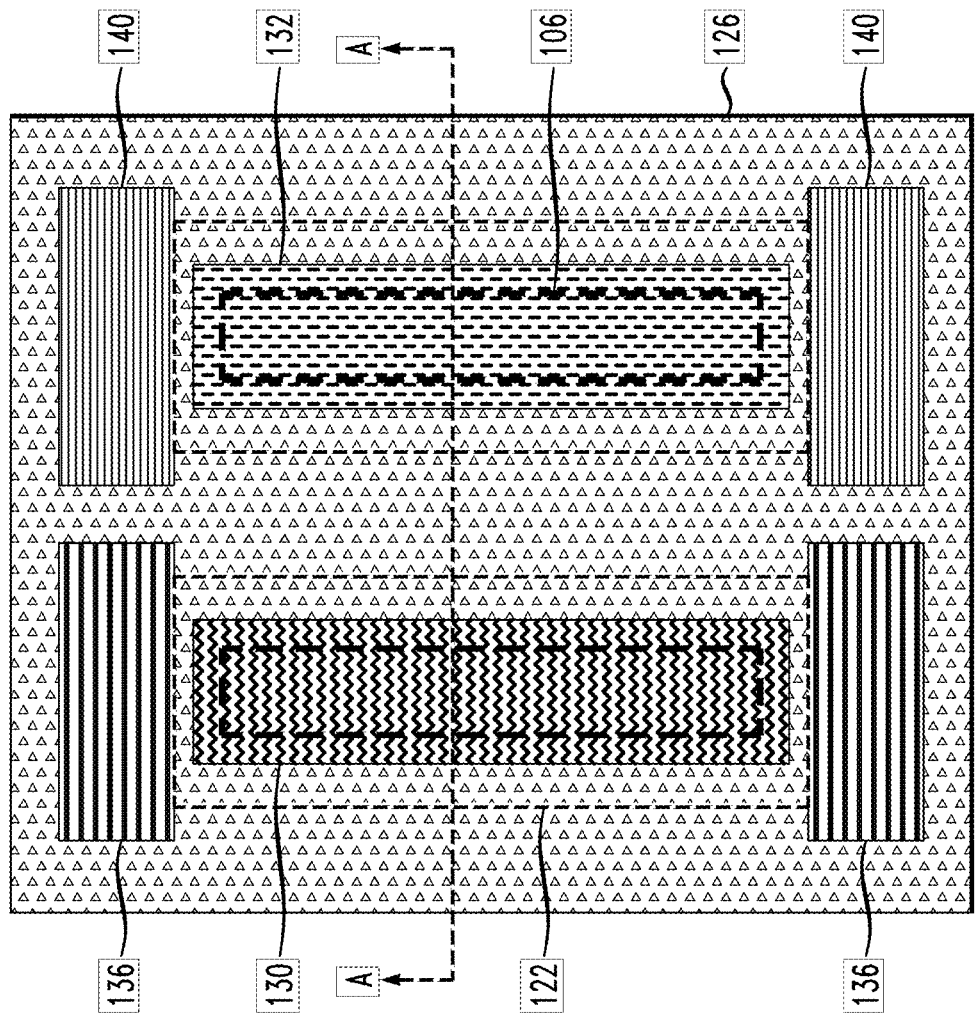

REPLACEMENT METAL GATE PROCESS FOR VERTICAL TRANSPORT FIELD-EFFECT TRANSISTORS WITH MULTIPLE THRESHOLD VOLTAGES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for replacement metal gate processes for forming vertical transport field-effect transistors with multiple threshold voltages.

In one embodiment, a method of forming a semiconductor structure comprises forming a plurality of fins over a top surface of a bottom source/drain region disposed over a top surface of a substrate, the fins providing vertical transport channels for a plurality of vertical transport field-effect transistors. The method also comprises forming a first gate conductor surrounding a first one of an adjacent pair of the plurality of fins providing a first vertical transport channel for a first vertical transport field-effect transistor, forming a second gate conductor surrounding a second one of the adjacent pair of the plurality of fins providing a second vertical transport channel for a second vertical transport field-effect transistor, and forming at least one shared gate contact to the first gate conductor and the second gate conductor, the at least one shared gate contact being formed at first ends of the adjacent pair of the plurality of fins.

In another embodiment, a semiconductor structure comprises a substrate, a bottom source/drain region disposed on a top surface of the substrate, a plurality of fins disposed over a top surface of the bottom source/drain region, the fins providing vertical transport channels for one or more vertical transport field-effect transistors, a first gate conductor disposed surrounding a first one of an adjacent pair of the plurality of fins providing a first vertical transport channel for a first vertical transport field-effect transistor, a second gate conductor disposed surrounding a second one of the adjacent pair of the plurality of fins providing a second vertical transport channel for a second vertical transport field-effect transistor, and at least one shared gate contact to the first gate conductor and the second gate conductor, the at least one shared gate contact being disposed at first ends of the adjacent pair of the plurality of fins.

In another embodiment, an integrated circuit comprises one or more vertical transport field-effect transistors comprising a substrate, a bottom source/drain region disposed on a top surface of the substrate, a plurality of fins disposed over a top surface of the bottom source/drain region, the fins providing vertical transport channels for the one or more vertical transport field-effect transistors, a first gate conductor disposed surrounding a first one of an adjacent pair of the plurality of fins providing a first vertical transport channel for a first vertical transport field-effect transistor, a second gate conductor disposed surrounding a second one of the adjacent pair of the plurality of fins providing a second vertical transport channel for a second vertical transport field-effect transistor, and at least one shared gate contact to the first gate conductor and the second gate conductor, the at least one shared gate contact being disposed at first ends of the adjacent pair of the plurality of fins.

BRIEF DESCRIPTION OF THE DRAWINGS

FIG. 3A depicts a cross-sectional view of the FIG. 2 structure following recess of the capping and dielectric layer, and following formation of top spacers, according to an embodiment of the invention.

FIG. 3B depicts a top-down view of the FIG. 3A structure, according to an embodiment of the invention.

FIG. 4 depicts a cross-sectional view of the FIG. 3A structure following a self-aligned cut of the dummy gate and following deposition of an encapsulation layer, according to an embodiment of the invention.

FIG. 8B depicts a top-down view of the FIG. 8A structure, according to an embodiment of the invention.

FIG. 11B depicts a top-down view of the FIG. 11A structure, according to an embodiment of the invention.

FIG. 13A depicts a first cross-sectional view of the FIG. 12 structure following formation of contacts, according to an embodiment of the invention.

FIG. 14 depicts a top-down view of the FIG. 11A structure following patterning of the hard mask to remove the dummy gate from both ends of the fins, according to an embodiment of the invention.

DETAILED DESCRIPTION

Figure 1:
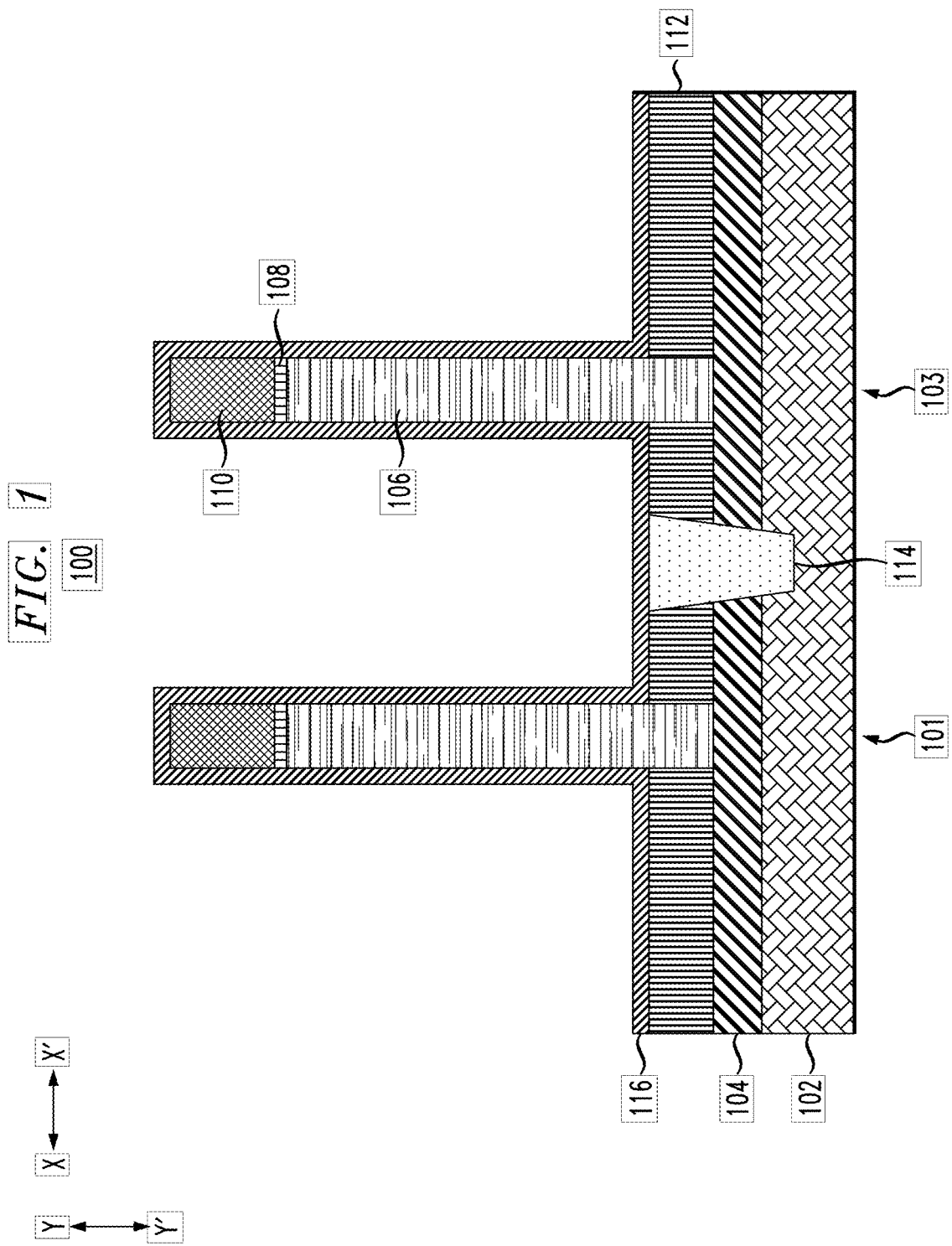
FIG. 1 depicts a cross-sectional view of fins formed over a substrate after deposition of a dielectric layer, according to an embodiment of the invention.

Illustrative embodiments of the invention may be described herein in the context of illustrative methods for replacement metal gate processes for forming vertical transport field-effect transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Vertical transport FETs (VTFETs) are being pursued as viable CMOS architectures for scaling to 7 nanometers (nm) and beyond. VTFETs provide the opportunity for further device scaling compared with other device architectures. Processes for forming VTFETs, however, may have strict constraints on thermal budgets for certain downstream processing steps such as top source/drain epitaxial growth and dopant activation anneal when the high-k metal gate module is formed earlier in the process. High temperature processes (e.g., at temperatures above 550° C.) for the top source/drain region can cause undesired threshold voltage (Vt) shift, increase in inversion thickness (Tinv), and leakage current (Toxgl) degradation due to oxygen and metal diffusion into the channel. Embodiments provide improved processes for forming VTFETs with replacement metal gate (RMG) processes wherein a dummy gate is formed vertically first followed by the top junction or top source/drain regions, followed by a horizontal dummy gate pull (e.g., from one or both lateral ends of the fins).

Embodiments provide methods for VTFET formation with RMG processes, advantageously removing the thermal budgets for the gate stacks. In some embodiments, a high-k dielectric or gate dielectric first process is used to solve the patterning problems and meet reliability requirements in the RMG process. In addition, some embodiments use a horizontal dummy gate pull and metal gate deposition to define the metal gate. To form CMOS VTFET structures, the dummy gate may be pulled out individually surrounding different sets of fins. Embodiments may further provide for multiple-Vt VTFET structures through pulling the dummy gate individually for different groups of fins, and filling the gate conductor surrounding such different sets of fins individually to achieve desired Vt values for different groups of VTFETs.

Illustrative RMG processes for forming multi-Vt VTFET structures will now be described with respect to FIGS. 1-18.

In some embodiments, the RMG process includes growth of a gate dielectric (e.g., silicon dioxide ($SiO_2$), hafnium oxide ($HfO_2$), etc.) over a plurality of fins disposed on a substrate, followed by a post-deposition anneal and reliability anneal. The fins provide vertical transport channels for VTFETs. In some embodiments, different sets of the plurality of fins provide channels for n-type VTFETs (nFETs) and p-type VTFETs (pFETs). A bottom source/drain region may be formed over the top surface of the substrate below each of the fins. A bottom spacer may be disposed over the bottom source/drain region and surrounding at least a portion of the sidewalls of each of the fins. Shallow trench isolation (STI) regions may be formed in the bottom spacer and bottom source/drain region between different sets of fins used for forming nFETs and pFETs. Each fin may initially be topped with an oxide and hard mask.

A capping layer (e.g., titanium nitride (TiN)) is deposited over the gate dielectric, followed by deposition and planarization of a sacrificial material (e.g., a dummy gate material). The sacrificial material, capping layer and gate dielectric are then recessed, followed by formation of a top spacer. The sacrificial material is then etched, using a self-alignment method, to form dummy gates. An encapsulation layer is deposited, followed by oxide fill and planarization. Top source/drain regions are then formed over the plurality of fins. The top source/drain regions may include different epitaxial growth for n-type and p-type VTFETs. A gate open is formed on the side(s) (e.g., from one or both lateral ends) of the fins, followed by poly gate open and gate formation (e.g., by atomic layer deposition (ALD)) for one of nFETs and pFETS followed by poly gate open and gate formation for the other one of nFETs and pFETs. An oxide is then formed over the structure and openings in the oxide are formed to deposit contacts to the bottom source/drain region, the top source/drain regions, and to the gate regions.

FIG. 1 shows a cross-sectional view 100 of a structure including a substrate 102, a bottom junction or source/drain region 104 disposed over a top surface of the substrate 102, and a plurality of fins 106 disposed over the bottom source/drain region 104. The fins 106 provide vertical transport channels for VTFETs formed using processes described herein. The fins 106 may provide channels for different types of VTFETs (e.g., an nFET 101 and a pFET 103). Each of the fins 106 is topped with an oxide 108 and hard mark (HM) 110. A bottom spacer 112 is disposed over the bottom source/drain region 104 surrounding at least a portion of the sidewalls of the fins 106. STI region 114 is disposed between the nFET 101 and pFET 103 in the bottom spacer 112 and bottom source/drain region 104. A gate dielectric 116 is deposited over the structure as illustrated.

The substrate 102 may comprise a semiconductor substrate formed of silicon (Si), although other suitable materials may be used. For example, the substrate 102 can include any suitable substrate structure, e.g., a bulk semiconductor. The substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The size of the substrate 102 may vary, such as based on the number of VTFETs that are to be formed thereon. The vertical thickness or height of the substrate (in direction Y-Y') may be in the range of 10 micrometers (μm) to 100 millimeters (mm), although other heights above or below this range may be used as desired for a particular application.

The bottom junction or bottom source/drain region 104 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (Tl). The bottom source/drain region 104 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRP-CVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$.

The bottom source/drain region 104 may have a height or vertical thickness (in direction Y-Y') in the range of 10 nanometers (nm) to 100 nm, although other heights above or below this range may be used as desired for a particular application.

The fins 106 provide the vertical transport channels for the resulting VTFETs (e.g., nFET 101 and pFET 103). The fins 110 may be formed of the same material as the substrate 102, and may be formed using sidewall image transfer (SIT) or other suitable techniques such as lithography and etching including reactive-ion etching (ME), etc.

Each of the fins 106 may have a width or horizontal thickness (in direction X-X') in the range of 5 nm to 15 nm, although other widths above or below this range may be used as desired for a particular application. Each of the fins 106 may have a height or vertical thickness (in direction Y-Y') ranging from 15 nm to 100 nm, although other heights above or below this range may be used as desired for a particular application. A spacing between adjacent ones of the fins 106 may be in the range of 20 nm to 60 nm, although other spacing may be used as desired for a particular application.

The oxide layer 108 is formed over each of the fins 110. The oxide layer 108 may be formed of silicon oxide (SiO$_x$) or another suitable material such as silicon oxynitride (SiO$_x$N$_y$), silicon oxycarbide (SiOC), etc. The oxide layer 108 may have a height or vertical thickness (in direction Y-Y') ranging from 1 nm to 5 nm, although other heights above or below this range may be used as desired for a particular application.

Although not shown in FIG. 1, an interfacial layer may be formed on sidewalls of the fins 106 (e.g., disposed between the gate dielectric 116 and the sidewalls of the fins 106). The interfacial layer may be formed of SiO$_2$ or another suitable material such as SiO$_x$N$_y$. The interfacial layer may have a width or horizontal thickness (in direction X-X') ranging from 0.5 nm to 1.5 nm, although other widths above or below this range may be used as desired for a particular application.

HM 110 is formed over the oxide layer 108 on top of each of the fins 106. The HM 110 may be formed of a nitride such as silicon nitride (SiN), although other suitable materials may be used. The HM 110 may have a height or vertical thickness (in direction Y-Y') in the range of 20 nm to 80 nm, although other heights above or below this range may be used as desired for a particular application. The HM 110 may be patterned over an initial substrate, with the resulting substrate 102 being formed by etching in the regions exposed by the HM 110 to form the fins 106 from the initial substrate. The HM 110, in some embodiments, may be formed a multi-layer such as two layers including a nitride and oxide (e.g., SiN/SiO$_2$), three layers including one or more nitride and one or more oxide layers (e.g., SiN/SiO$_2$/SiN, SiO$_2$/SiN/SiO$_2$), etc.

The bottom spacer 112 is formed over the bottom source/drain region 104, such as using non-conformal deposition and etch-back processing (e.g., physical vapor deposition (PVD), high density plasma (HDP) deposition, etc.). The bottom spacer 112 may be formed of SiO$_2$, SiN, silicon carbide oxide (SiCO), silicon boron carbide nitride (SiBCN), etc., although other suitable materials may be used. The bottom spacer 112 may have a height or vertical thickness (in direction Y-Y') in the range of 3 nm to 15 nm, although other heights above or below this range may be used as desired for a particular application.

The STI region 114 may be formed of a dielectric material such as silicon dioxide (Sift), silicon oxycarbide (SiOC), silicon oxynitride (SiON), etc. The STI region 114 isolates the bottom junction or bottom source/drain region 104 to provide separate addressability of the different VTFETs (e.g., nFET 101 and pFET 103) that are formed.

The dielectric layer 116 is formed over the entire structure as illustrated in FIG. 1. The dielectric layer 116 provides the gate dielectric for the resulting VTFETs. The dielectric layer 116 may be formed of a high-k dielectric material. Examples of high-k materials include but are not limited to metal oxides such as hafnium oxide (HfO$_2$), hafnium silicon oxide (Hf—Si—O), hafnium silicon oxynitride (HfSiON), lanthanum oxide (La$_2$O$_3$), lanthanum aluminum oxide (LaAlO$_3$), zirconium oxide (ZrO$_2$), zirconium silicon oxide, zirconium silicon oxynitride, tantalum oxide (Ta$_2$O$_5$), titanium oxide (TiO$_2$), barium strontium titanium oxide, barium titanium oxide, strontium titanium oxide, yttrium oxide (Y$_2$O$_3$), aluminum oxide (Al$_2$O$_3$), lead scandium tantalum oxide, and lead zinc niobate. The high-k material may further include dopants such as lanthanum (La), aluminum (Al), and magnesium (Mg). The dielectric layer 116 may have a uniform thickness in the range of 1 nm to 3 nm, although other thicknesses above or below this range may be used as desired for a particular application.

Figure 2:
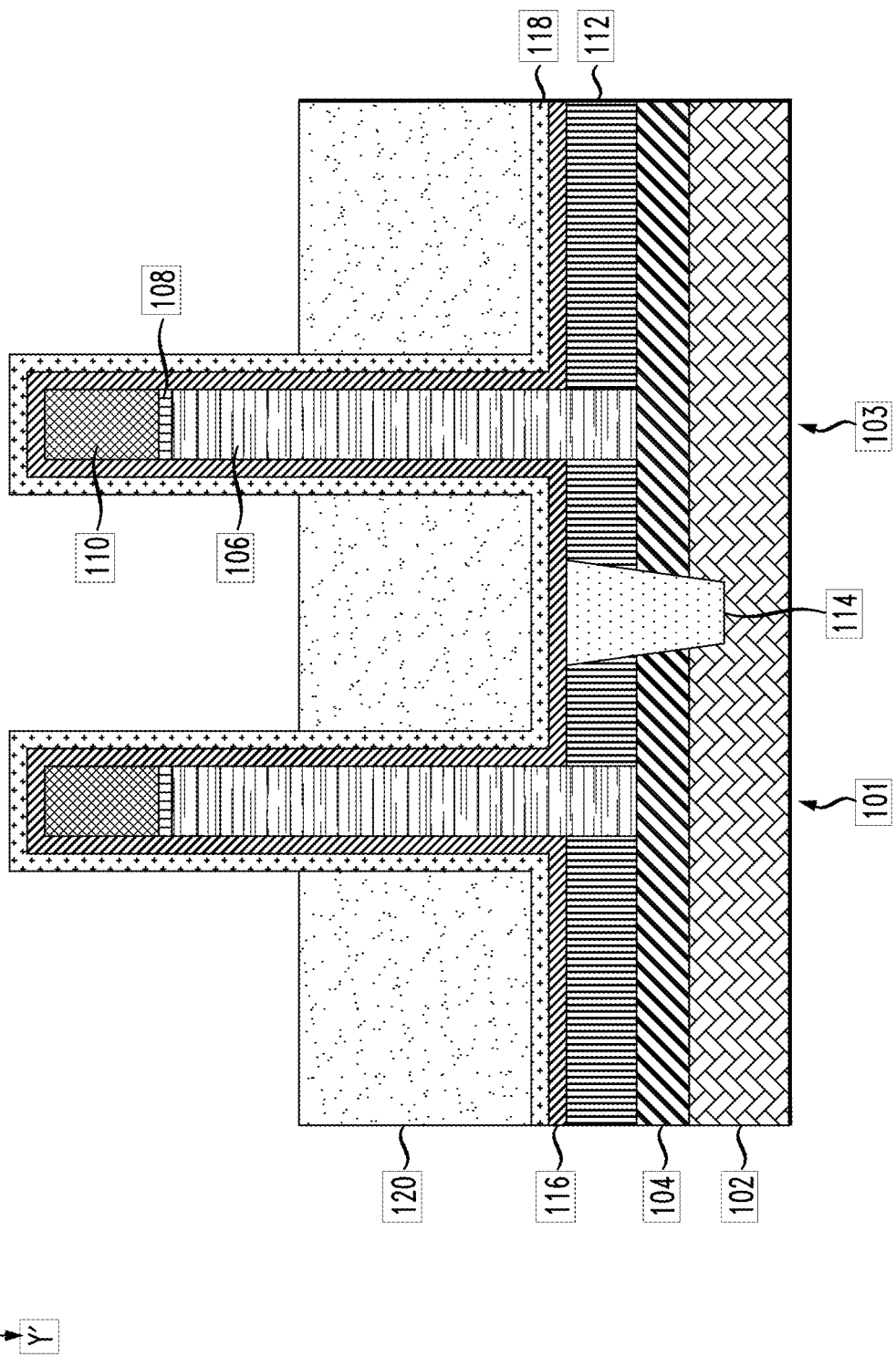
FIG. 2 depicts a cross-sectional view of the FIG. 1 structure following deposition of a capping layer and following deposition and recess of a dummy gate, according to an embodiment of the invention.

FIG. 2 shows a cross-sectional view 200 of the FIG. 1 structure following deposition of a capping layer 118 over the dielectric layer 116, and following deposition and recess of a sacrificial material 120. The capping layer 118 may be formed of titanium nitride (TiN) or another suitable material such as tantalum nitride (TaN) titanium silicon nitride (TiSiN), etc. The capping layer 118 may have a uniform thickness in the range of 1 nm to 5 nm, although other thicknesses above or below this range may be used as desired for a particular application.

The sacrificial material 120 may initially be deposited to fill the structure, and then recessed below a top surface of the fins 106 as illustrated. The sacrificial material 120 may be formed of amorphous silicon (a-Si), amorphous silicon germanium (a-SiGe), SiO$_2$, titanium oxide (TiO$_2$), titanium nitride (TiN) or another suitable material. After recess, the sacrificial material 120 may have a vertical thickness or height (in direction Y-Y') ranging from 10 nm to 60 nm, although other suitable heights above or below this range may be used as desired so long as the height of the recessed sacrificial material 120 is below the top surface of the fins 106.

The sacrificial material 120 is also referred to herein as dummy gate 120, as it forms the dummy gate following a self-alignment cut described in further detail below.

FIG. 3A shows a cross-sectional view 300 of the FIG. 2 structure following recess of the capping layer 118 and the dielectric layer 116, and following formation of top spacers 122. FIG. 3B shows a top-down view 350 of the FIG. 3A structure. The cross-sectional view 300 of FIG. 3A is taken along the line A-A shown in the top-down view 350.

The capping layer 118 and dielectric layer 116 may be recessed using an SC1 and hydrofluoric acid (HF)/ethyl glycol (EG) etch, although other suitable wet and/or dry etches may be used to recess the capping layer 118 and dielectric layer 116 in other embodiments.

The top spacers 122 are formed on exposed sidewalls of the fins 106, oxide 108 and HM 110 as illustrated in FIG. 3A. The top spacers 122 may be formed through a conformal deposition process followed by RIE. The top spacers 122 may be formed of a nitride such as SiN or another suitable material such as SiBCN, SiOC, silicon carbonitride (SiCN), etc. At their widest points (e.g., proximate the top surface of the recessed sacrificial material 120), the top spacers 122 have a width or horizontal thickness (in direction X-X') ranging from 10 nm to 20 nm. The width then tapers proximate the top surface of the HM 110 to a width or horizontal thickness (in direction X-X') ranging from 1 nm to 6 nm. The width of the top spacers 122 at their widest and narrowest points may vary above or below these ranges as desired for a particular application, although there should be sufficient spacing between the top spacers 122 for the self-alignment cut described in further detail below.

As illustrated in the top-down view 350 of FIG. 3B, the top spacers 122 are formed "wider" at the corners at a first end of the fins 106. This facilitates opening for removing the sacrificial material/dummy gate 120 and later formation of a gate conductor. In some embodiments, the top spacers 122 are formed wider at the corners at both ends of the fins, as illustrated in the dashed outlines 122'-1 and 122'-2. As will be described in further detail below, this facilitates pulling or removal of the sacrificial material/dummy gate 120 and formation of the gate conductor from both ends of the fins 106. This further permits the connection of the gate conductors for nFET 101 and pFET 103 at both ends of the fins 106.

FIG. 4 shows a cross-sectional view 400 of the FIG. 3A structure following a self-aligned cut of the sacrificial material 120, and following deposition of an encapsulation layer 124. The top spacers 122 are used to perform self-aligned cuts of the sacrificial material 120, resulting in dummy gates 120 surrounding each of the fins 106.

The encapsulation layer 124 may be formed of a nitride such as SiBCN, SiN, SiCN, etc. The encapsulation layer 124 may be deposited using processing such as chemical vapor deposition (CVD), plasma-enhanced chemical vapor deposition (PECVD), atomic layer deposition (ALD), etc. The encapsulation layer 124 may have a uniform thickness in the range of 3 nm to 15 nm, although other thicknesses above or below this range may be used as desired for a particular application.

Figure 5:
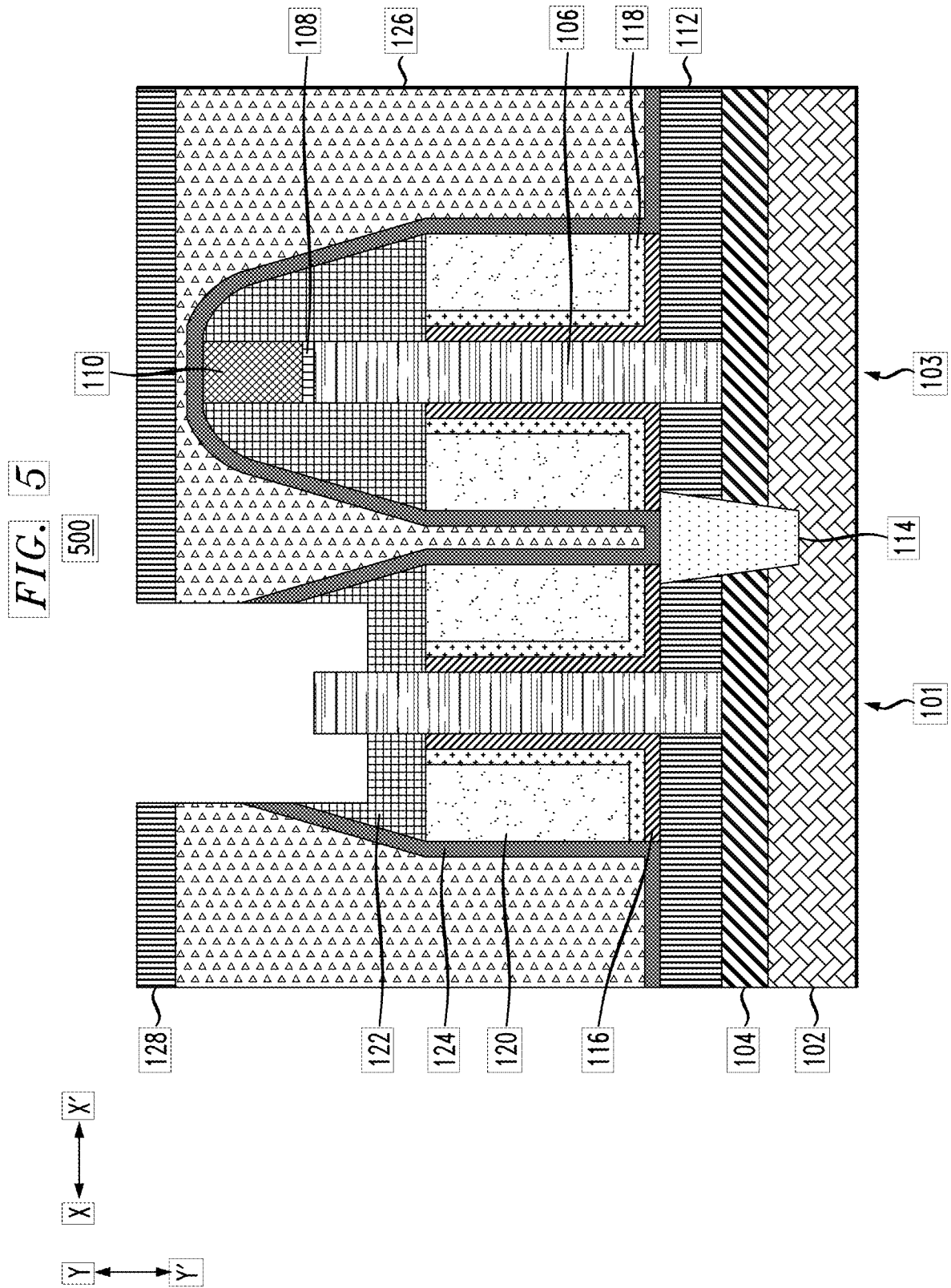
FIG. 5 depicts a cross-sectional view of the FIG. 4 structure following open for formation of a top source/drain region over a first one of the fins, according to an embodiment of the invention.

FIG. 5 shows a cross-sectional view 500 of the FIG. 4 structure following deposition of an oxide 126, patterning of a mask 128 over the oxide 126, and opening to expose a top surface of the fin 106 for the nFET 101.

The oxide 126 may be filled over the structure and then planarized using chemical mechanical polishing (CMP) or another suitable planarization technique. After planarization the oxide 126 has a vertical thickness or height (in direction Y-Y'), measured from a top of the encapsulation layer 124 formed over the bottom spacer 112, in the range of 40 nm to 150 nm. The mask 128 may be formed of SiN or another suitable material, and may be patterned using RIE or other suitable processing to expose the oxide 126 formed over the top surface of the fin 106 for the nFET 101. The opening in the mask 128 also exposes portions of the top spacer 122 surrounding the fin 106 for the nFET 101. As illustrated, the opening in the mask 128 is wider (e.g., in the range of 5 nm to 10 nm) than that of the top surface of the fin 106 for the nFET 101 such that portions of the top spacer 122 adjacent the fin 106 for the nFET 101 are removed during the top junction open. In other embodiments, however, the opening in the mask 128 need not be wider than that of the top surface of the fins 106, so long as good epitaxial growth may be achieved on the exposed surface of the fins 106 as will be described in further detail below.

The oxide 126, encapsulation layer 124 and top spacer 122, HM 110 and oxide layer 108 surrounding and disposed over the fin 106 for the nFET 101 are then removed using any suitable processing, such as RIE and wet etch processing. This exposes the top surface and a portion of the sidewalls of the fin 106 for the nFET 101.

Figure 6:
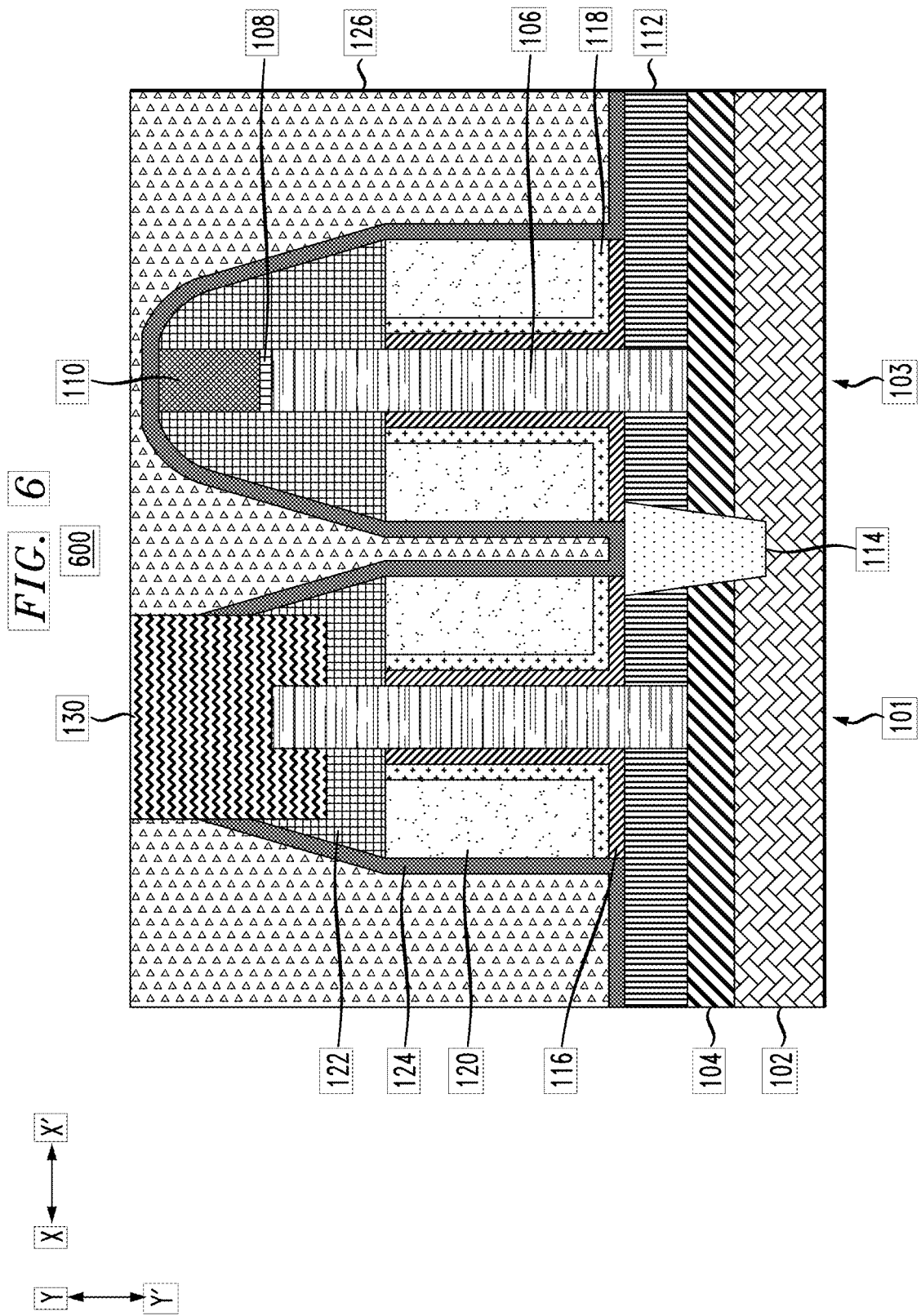
FIG. 6 depicts a cross-sectional view of the FIG. 5 structure following formation of the top source/drain region over the first fin, according to an embodiment of the invention.

FIG. 6 shows a cross-sectional view 600 of the FIG. 5 structure following formation of top source/drain region 130 over the fin 106 for the nFET 101. The top source/drain region 130 may be formed using processing similar to that described above with respect to formation of the bottom source/drain region 104. The top source/drain region 130 utilizes n-type dopants. The mask 128 is removed using any suitable processing, such as ME, wet etching, CMP, combinations thereof, etc.

Figure 7:
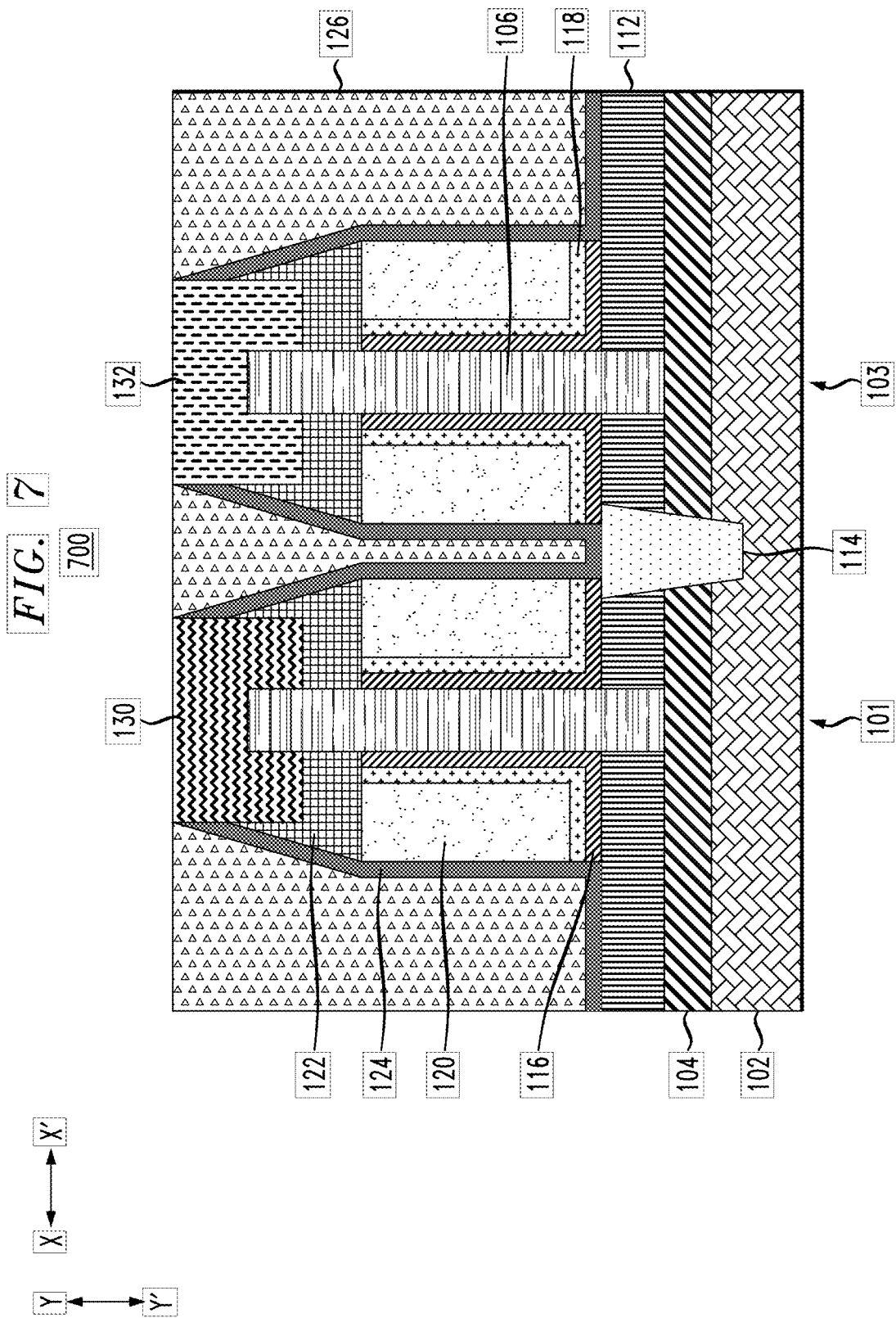
FIG. 7 depicts a cross-sectional view of the FIG. 6 structure following formation of a top source/drain region over a second one of the fins, according to an embodiment of the invention.

FIG. 7 shows a cross-sectional view 700 of the FIG. 6 structure following formation of top source/drain region 132 over the fin 106 for pFET 103. The top source/drain region 132 may be formed using processing similar to that described above with respect to formation of the top source/drain region 130, although the top source/drain region 132 utilizes p-type dopants where the top source/drain region 130 utilizes n-type dopants. To form the top source/drain region 132, an additional mask similar to mask 128 may be patterned with an opening that reveals the fin 106 for pFET 103 rather than fin 106 for nFET 101. The underlying oxide 126, encapsulation layer 124, top spacers 122, HM 110 and oxide 108 are then removed to expose the top surface and portions of the sidewalls of the fin 106 for the pFET 103. The structure of FIG. 7 is shown after removal of the additional mask. In some embodiments, an additional anneal may be performed to activate the top junction of top source/drain regions 130 and 132. This activation anneal may be at a temperature in the range of 700° C. to 1110° C. to form a low resistance extension junction.

Figure 8A:
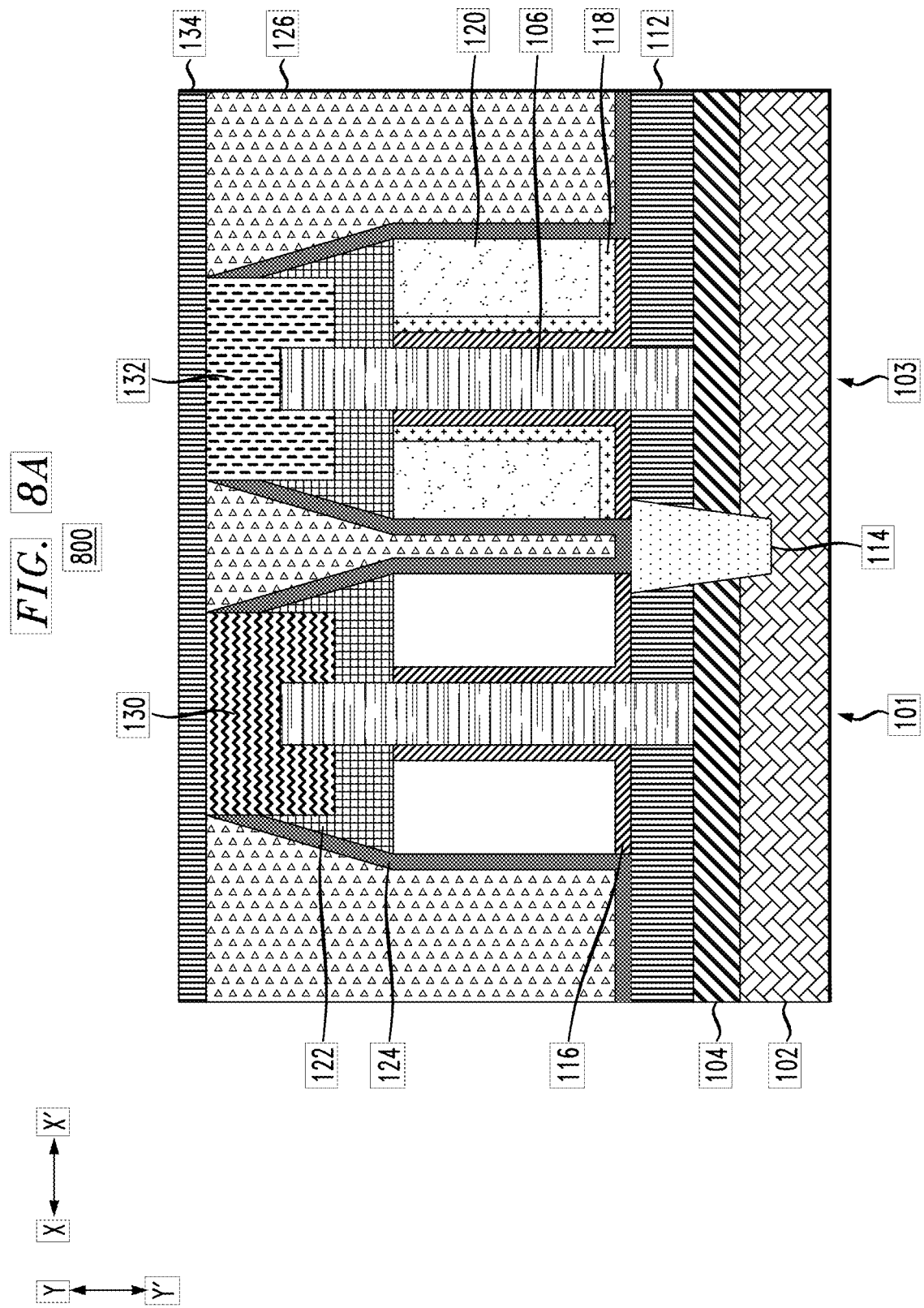
FIG. 8A depicts a cross-sectional view of the FIG. 7 structure following patterning of a hard mask and removal of the dummy gate surrounding the first fin, according to an embodiment of the invention.

FIG. 8A shows a cross-sectional view 800 of the FIG. 7 structure following patterning of a HM 134 and following removal of the dummy gate 120 surrounding the fin 106 for the nFET 101. FIG. 8B shows a top-down view 850 of the FIG. 8A structure, illustrating the patterning of the HM 134. The cross-sectional view 800 of FIG. 8A is taken along the line A-A shown in the top-down view 850.

It should be appreciated that in some embodiments, the dummy gate 120 surrounding the fin 106 for nFET 101 may be pulled from both ends by patterning the HM 134 to provide an opening in region 122'-1 at the other end of the fin 106 for nFET 101. The HM 134 may be formed of SiN or another suitable material such as TiN, with a vertical thickness or height (in direction Y-Y') ranging from 2 nm to 10 nm, although other heights above or below this range may be used as desired for a particular application. The HM 134 may be patterned using RIE or other suitable processing.

Figure 9:
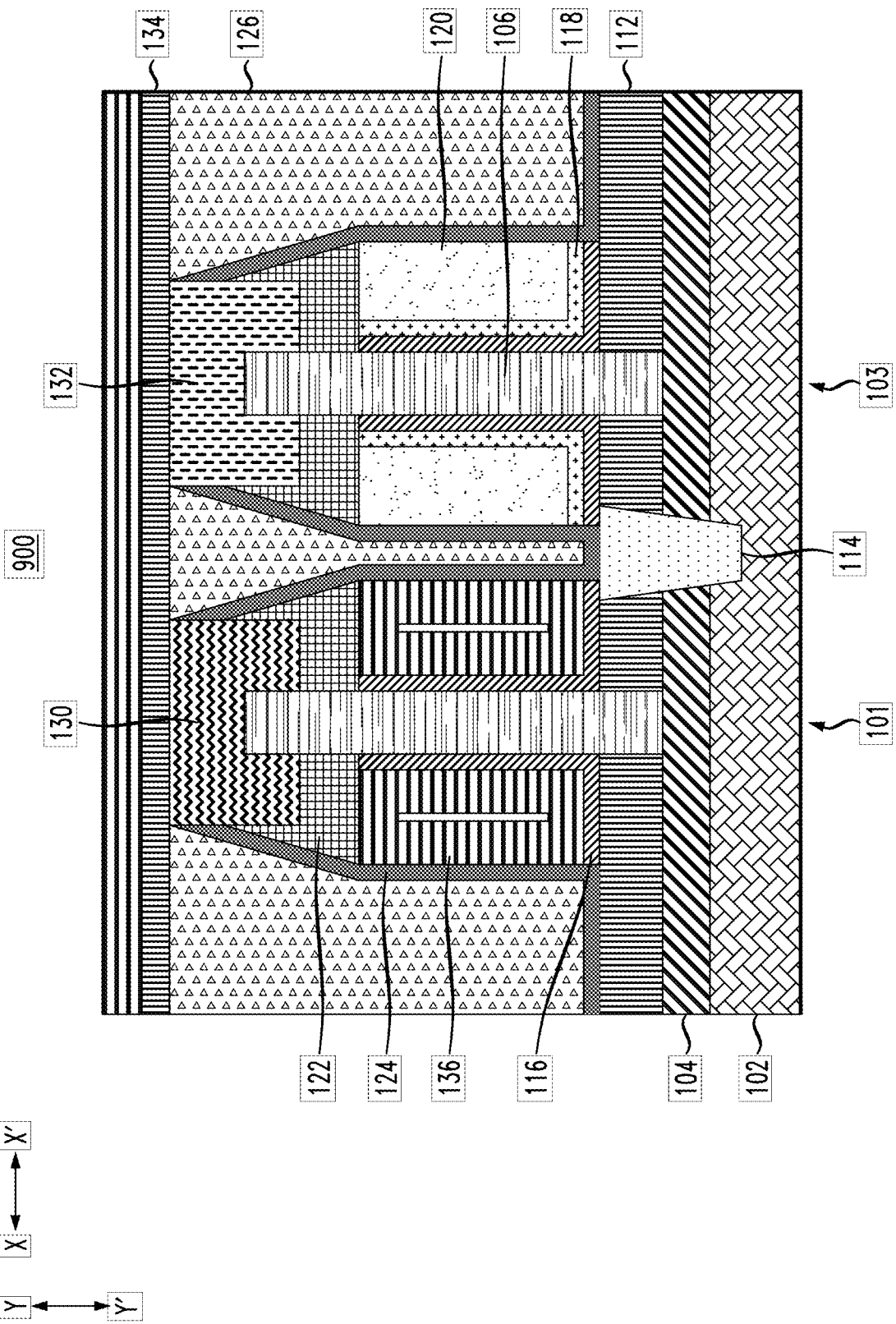
FIG. 9 depicts a cross-sectional view of the FIG. 8A structure following formation of a gate conductor surrounding the first fin, according to an embodiment of the invention.

FIG. 9 shows a cross-sectional view 900 of the FIG. 8A structure following formation of a gate conductor 136 surrounding the fin 106 for the nFET 101, also referred to herein as nFET gate conductor 136. The nFET gate conductor 136 may be formed of a work function metal (WFM) which can be, for example, titanium (Ti), aluminum (Al), titanium aluminum (TiAl), titanium aluminum carbon (TiAlC), or any combination of Ti and Al alloys, and can be a stack formed by a barrier layer (e.g., TiN) plus one or more of the WFM materials described above. Thus, the nFET gate conductor 136 may be referred to herein as nFET WFM 136. In some embodiments, the nFET WFM 136 comprises a multi-layer, such as a multi-layer of titanium nitride, titanium aluminum carbide and titanium nitride (TiN/TiAlC/TiN).

The nFET WFM 136 may be formed using a layer-by-layer ALD deposition process, with subsequent layers pinching off the remaining space until the region is completely filled as illustrated. This layer-by-layer deposition of the nFET WFM 136 may result in seams shown in vertical white lines in FIG. 9. The layer-by-layer deposition by ALD can form a metal layer ring as illustrated due to lateral tunneling deposition.

Figure 10:
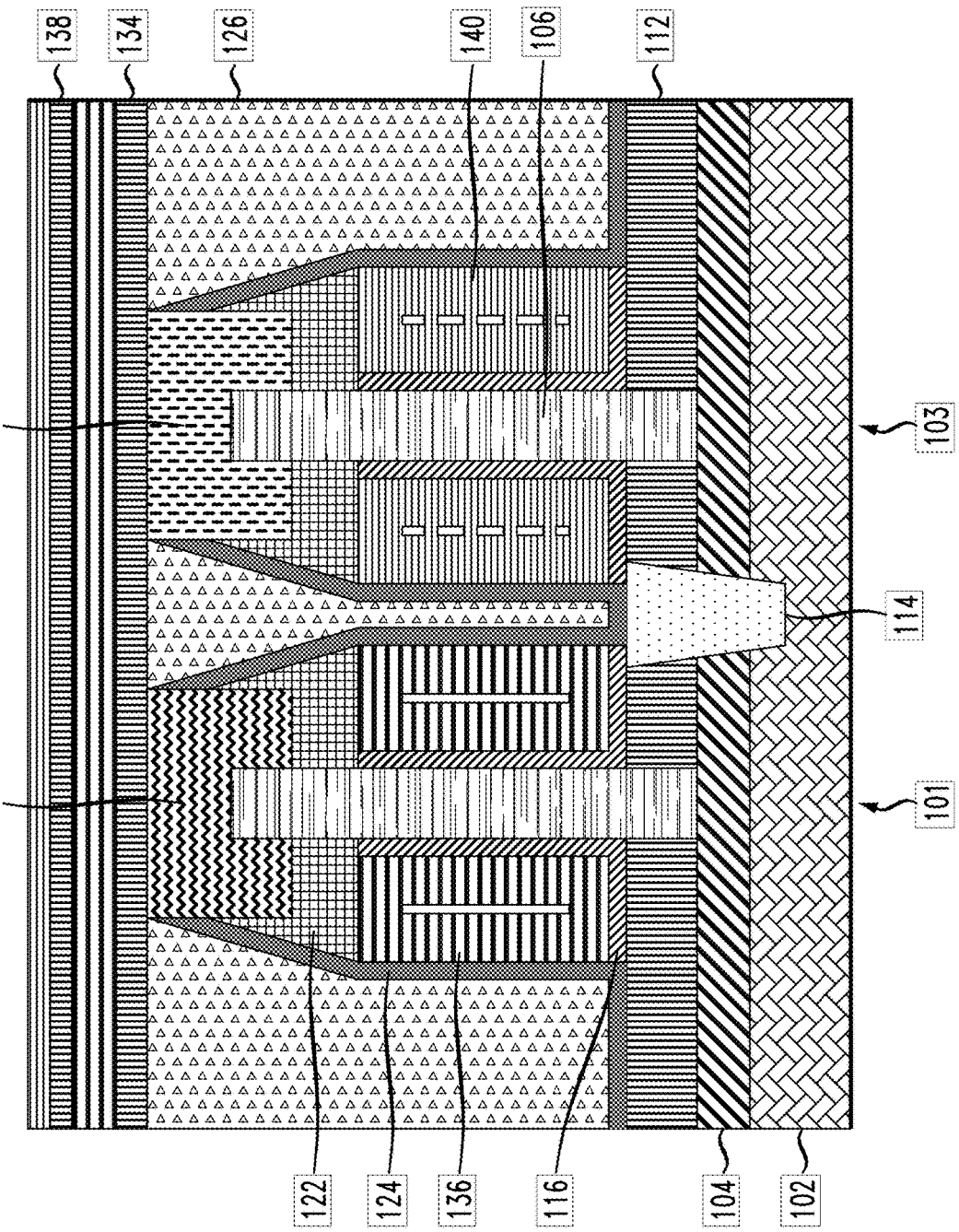
FIG. 10 depicts a cross-sectional view of the FIG. 9 structure following patterning of an additional hard mask, removal of the dummy gate surrounding the second fin, and following formation of a gate conductor surrounding the second fin, according to an embodiment of the invention.

FIG. 10 shows a cross-sectional view 1000 of the FIG. 9 structure following formation and patterning of an additional HM 138, removal of the dummy gate 120 surrounding the fin 106 for the pFET 103, and following formation of a gate conductor 140 surrounding the fin 106 for the pFET 103. The gate conductor 140 is also referred to herein as pFET gate conductor 140. The additional HM 138 may be patterned in a manner similar to that described above with respect to HM 136, except that the opening in the HM 138 is at one (or both) ends of the fin 106 for pFET 103 rather than the fin 106 for nFET 101.

The pFET gate conductor 140 may be formed of a WFM such as TiN, TaN, etc. The pFET gate conductor 140 thus may also be referred to herein as pFET WFM 140. The pFET WFM 140 may be formed of a metal stack where a thicker barrier layer (e.g., TiN or TaN) plus a WFM which can be, for example, titanium (Ti), aluminum (Al), titanium aluminum (TiAl), titanium aluminum carbon (TiAlC), or any combination of Ti and Al alloys, etc. The difference between the pFET WFM 140 and the nFET WFM 136 may be in the differing thickness used for barrier layers, differing WFM materials, and/or differing WFM thickness.

The pFET WFM 140, similar to nFET WFM 136, may be formed using a layer-by-layer ALD deposition process, with subsequent layers pinching off the remaining space until the region is completely filled as illustrated. This layer-by-layer deposition of the pFET WFM 140 may result in a discontinuity or interface shown in the dashed vertical white lines in FIG. 10.

Although the processing of FIGS. 5-10 is described above with respect to "nFET-first" processing (e.g., where the nFET top/source drain region 130 is formed prior to the pFET top source/drain region 132 and where the nFET WFM 136 is formed prior to the pFET WFM 140), embodiments are not so limited. In other embodiments, the pFET top source/drain region 132 may be formed prior to the nFET top/source drain region 130 and/or the pFET WFM 140 may be formed prior to the nFET WFM 136.

Figure 11A:
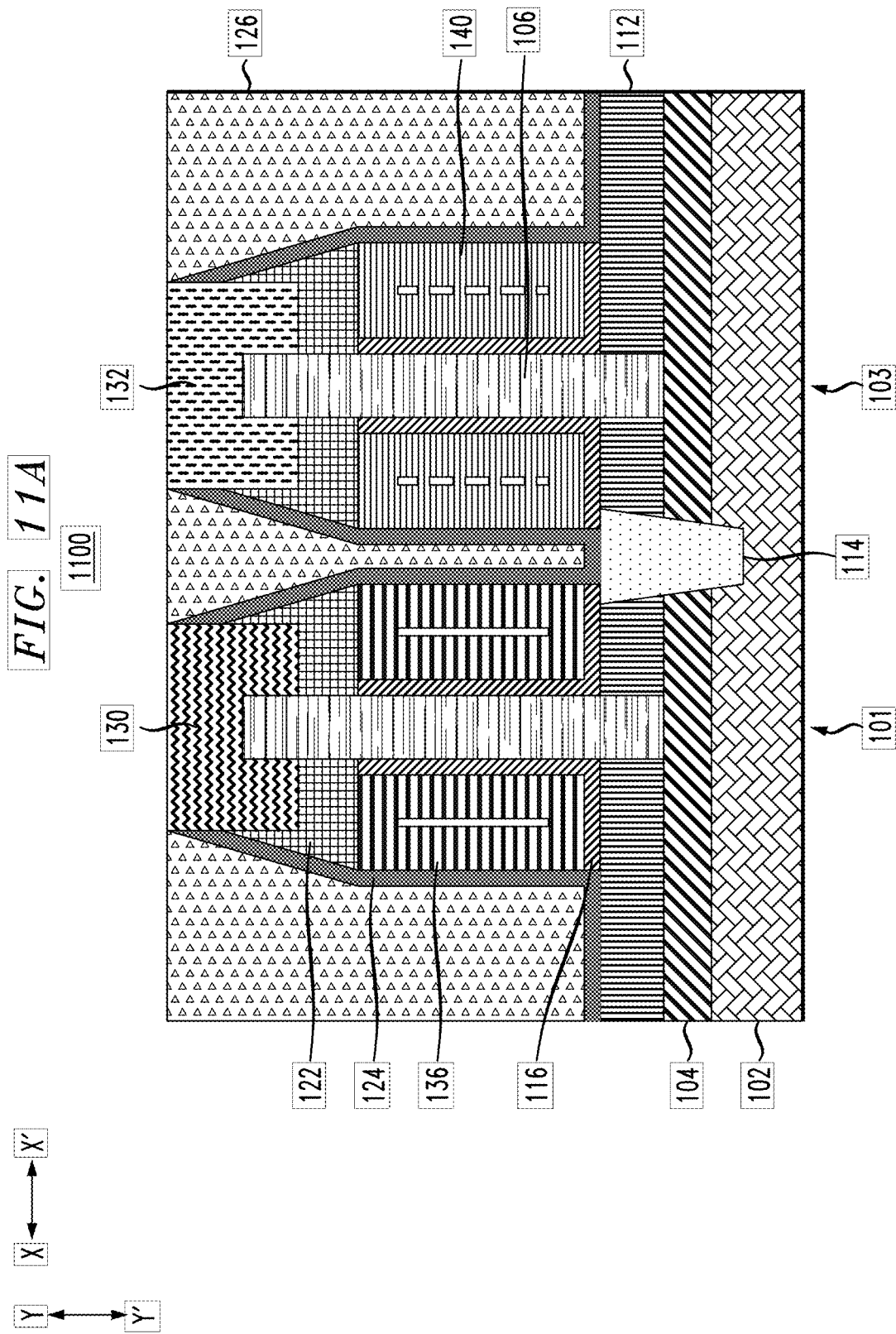
FIG. 11A depicts a cross-sectional view of the FIG. 10 structure following planarization, according to an embodiment of the invention.

FIG. 11A shows a cross-sectional view 1100 of the FIG. 10 structure following planarization utilizing CMP or another suitable technique to remove the HMs 134 and 136, and to remove portions of the nFET WFM 136 and pFET WFM 140 formed over the top surface of the structure above the oxide 126. FIG. 11B shows a top-down view 1150 of the FIG. 11A structure. The cross-sectional view 1100 of FIG. 11A is taken along the line A-A shown in the top-down view 1150. As illustrated in the top-down view 1150, the nFET WFM 136 and pFET WFM 140 are exposed at one end of the fins 106 for the nFET 101 and pFET 103, respectively. It should be appreciated, however, that in embodiments where the dummy gate 120 is pulled from both ends of the fins, the nFET WFM 136 and pFET WFM 140 would be filled from both ends and thus also exposed in the regions 122'-1 and 122'-2, respectively.

Figure 12:
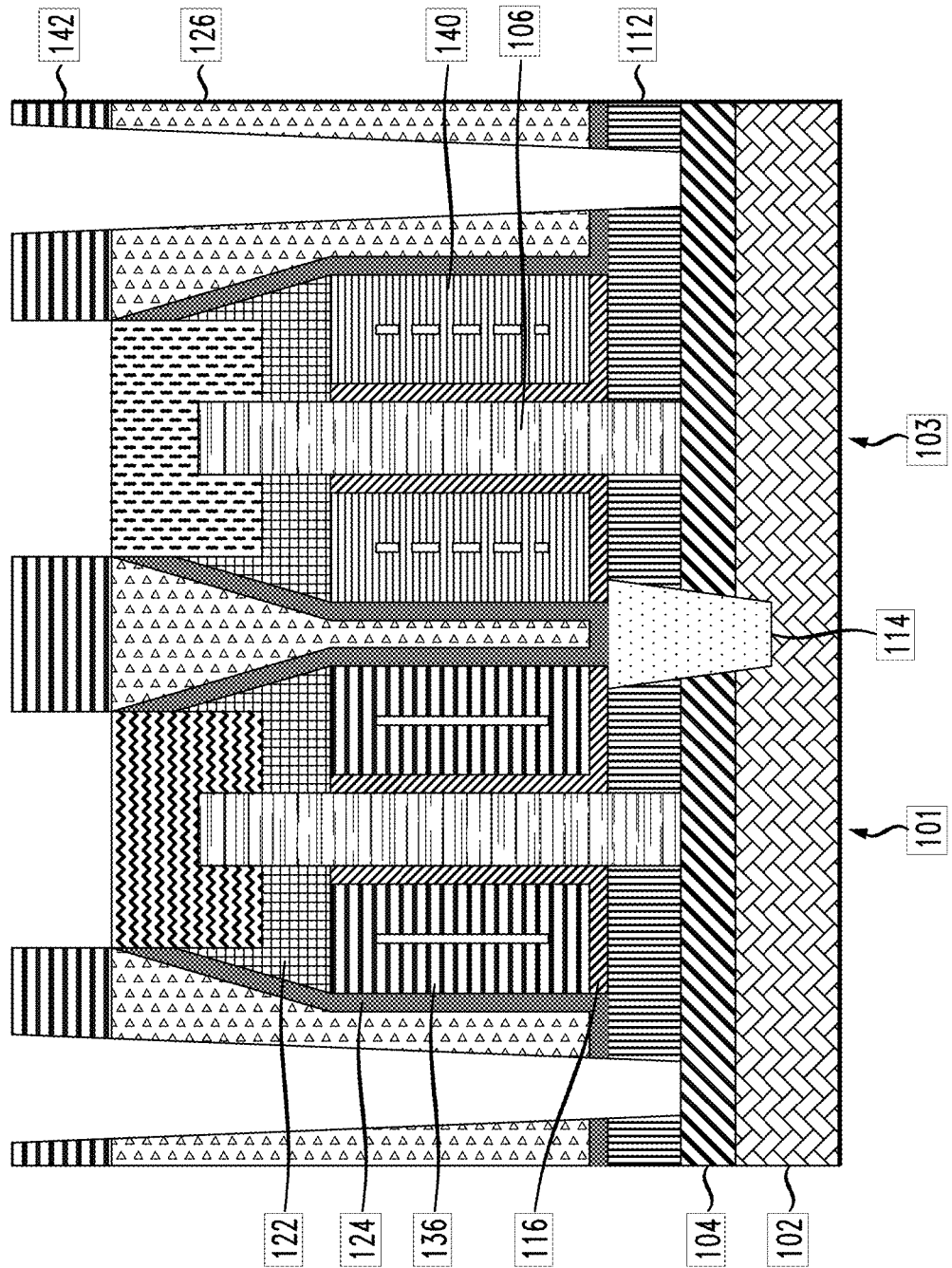
FIG. 12 depicts a cross-sectional view of the FIG. 11A structure following deposition of an oxide and forming openings for contacts, according to an embodiment of the invention.

FIG. 12 shows a cross-sectional view 1200 of the FIG. 11A structure following formation of an oxide 142 and forming openings for contacts. The oxide 142 may initially be deposited over the entire top surface of the structure, followed by patterning to form openings for formation of contacts to the bottom source/drain region 104 and to the top source/drain regions 130 and 132. The oxide 142 (as well as portions of the oxide 126 for forming contacts to the bottom source/drain region 104) may be patterned and removed using RIE or other suitable processing.

Figure 13B:
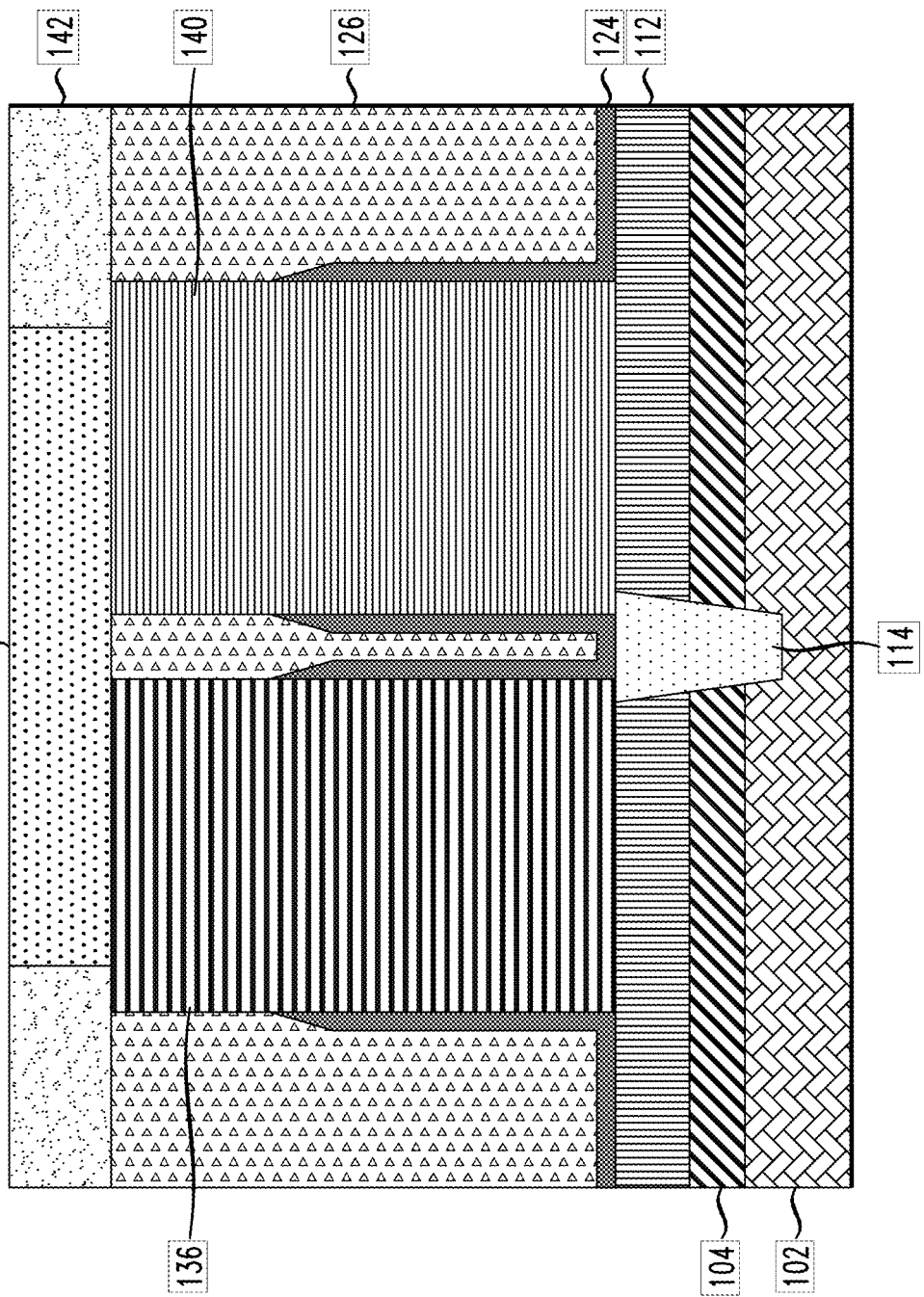
FIG. 13B depicts a second cross-sectional view of the FIG. 12 structure following formation of contacts, according to an embodiment of the invention.
Figure 13C:
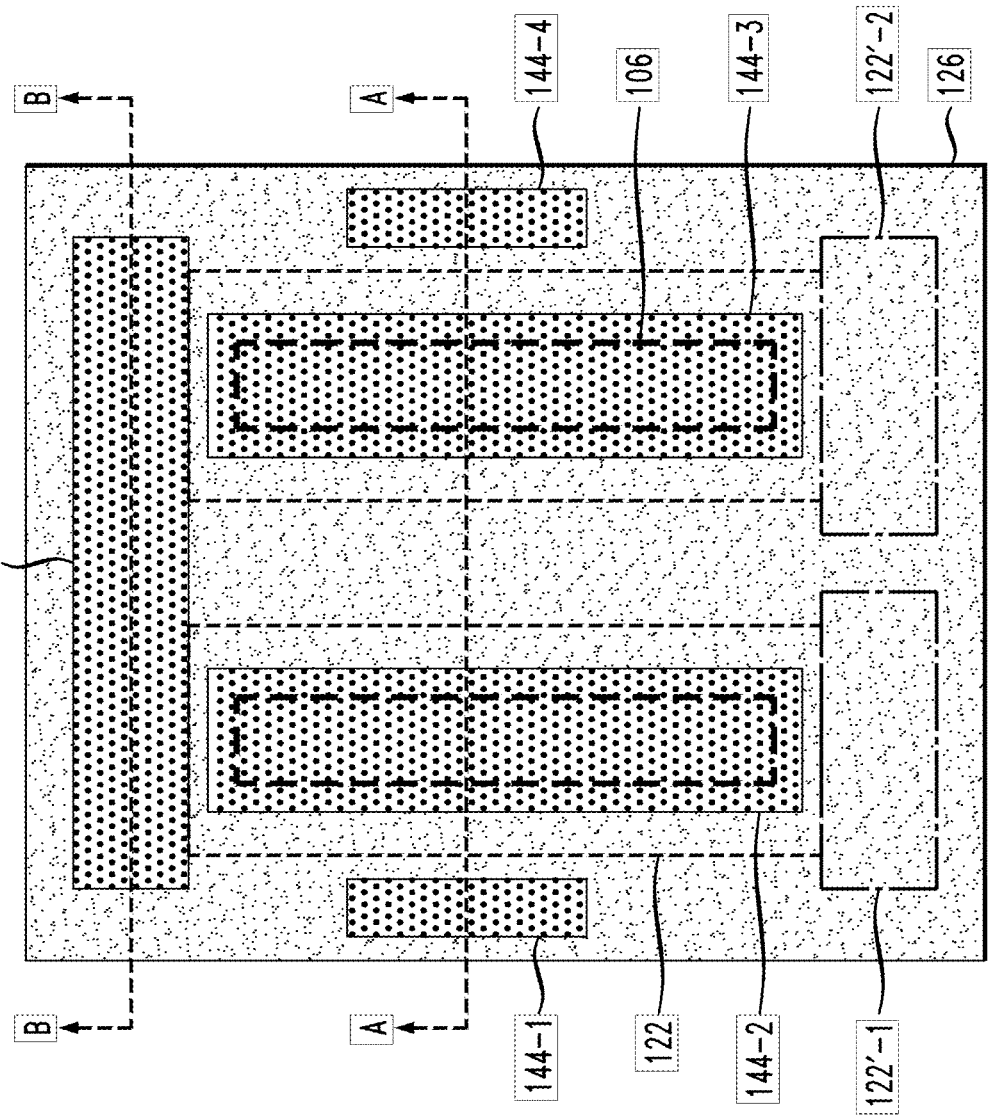
FIG. 13C depicts a top-down view of the structure shown in FIGS. 13A and 13B, according to an embodiment of the invention.

FIG. 13A shows a first cross-sectional view 1300 of the FIG. 12 structure following deposition of contact material. FIG. 13B shows a second cross-sectional view 1350 of the FIG. 12 structure following the deposition of the contact material. FIG. 13C shows a top-down view 1375 of the structure shown in FIGS. 13A and 13B. The cross-sectional view 1300 of FIG. 13A is taken across the fins 106 along the line A-A shown in the top-down view 1375. The cross-sectional view 1350 of FIG. 13B is taken across the gate contact 144-5 at one end of the fins 106 along the line B-B shown in the top-down view 1375.

Deposition of the contact material includes formation of a first bottom source/drain contact 144-1 for the nFET 101, formation of a first top source/drain contact 144-2 for the nFET 101, formation of a second top source/drain contact 144-3 for the pFET 103, formation of a second bottom source/drain contact 144-4 for the pFET 103, and formation of a shared gate contact 144-5 for the nFET 101 and pFET 103, which form a CMOS device. It should be appreciated that for embodiments wherein the dummy gate 120 is pulled from both ends of the fins 106, there may be an additional shared gate contact at the other end of the fins 106 as will be described in further detail below.

FIG. 14 shows a top-down view 1400 of the FIG. 11A structure, where the HM 122 is patterned at both ends of the fins 106 (e.g., in the regions denoted 122'-1 and 122'-2 in FIG. 11B). Thus, the nFET WFM 136 and pFET WFM 140 are exposed at both ends of the fins 106 as shown in FIG. 14.

Figure 15:
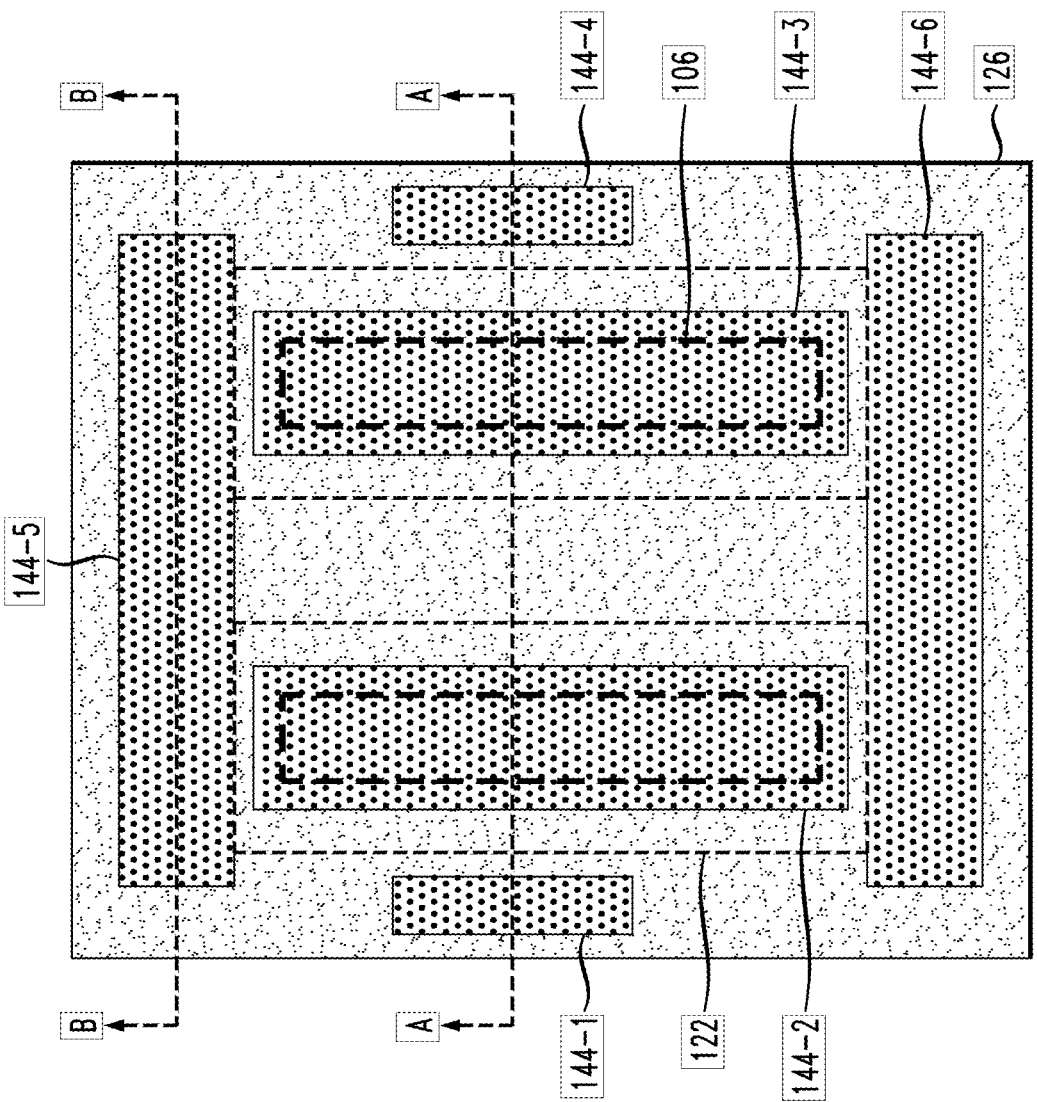
FIG. 15 depicts a top-down view of the structure shown in FIGS. 13A and 13B following formation of contacts to the gate conductors at both ends of the fins, according to an embodiment of the invention.

FIG. 15 shows a top-down view 1500 of the structure shown in FIGS. 13A and 13B following formation of the additional shared gate contact 144-6 at the other end of the fins 106 for embodiments where the HM 122 is patterned to pull the dummy gate 120 from both ends of the fins 106.

As discussed above, RMG processes described herein may be used for forming multi-Vt structures. In some embodiments, multi-Vt is achieved through metal oxide patterning before the reliability anneal of the gate dielectric 116.

Figure 16A:
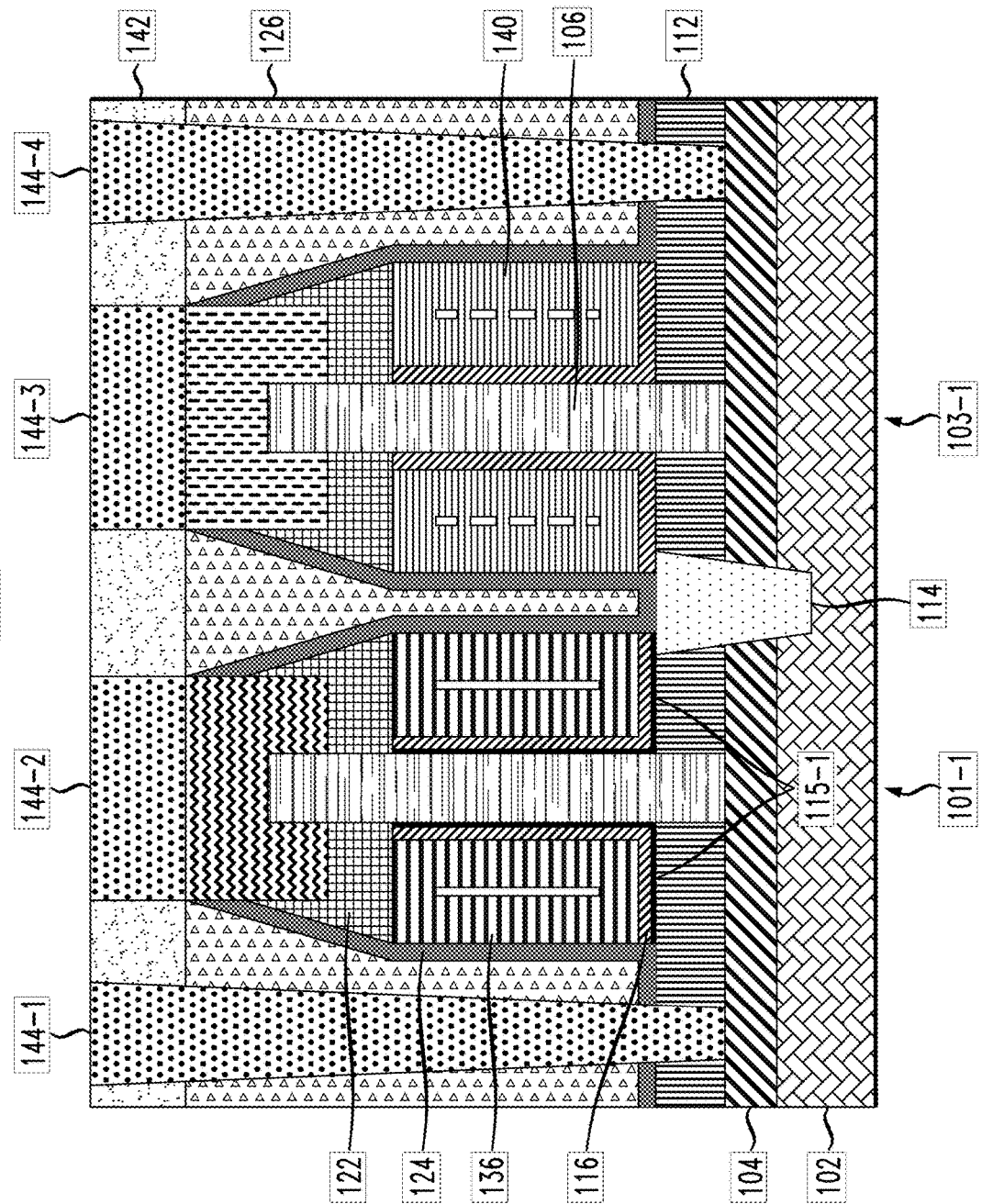
FIG. 16A depicts a first cross-sectional view across a first set of fins of a structure having first threshold voltages through the use of a metal oxide surrounding a first one of the fins, according to an embodiment of the invention.

FIG. 16A shows a first cross-sectional view 1600 across a first set of fins 106 of a structure. The FIG. 16A structure is similar to the structure shown in FIGS. 13A-13C, though a metal oxide layer 115-1 is formed surrounding the fin 106 for nFET 101-1. The metal oxide layer 115-1 may comprise a lanthanum (La)-based material, an yttrium (Y)-based material, an aluminum (Al)-based material, a magnesium (Mg)-based material, etc. The metal oxide layer 115-1 may be formed using any suitable processing. The metal oxide layer 115-1 may have a uniform thickness ranging from 1 angstrom (Å) to 10 Å, although other thicknesses above or below this range may be used as desired.

Figure 16B:
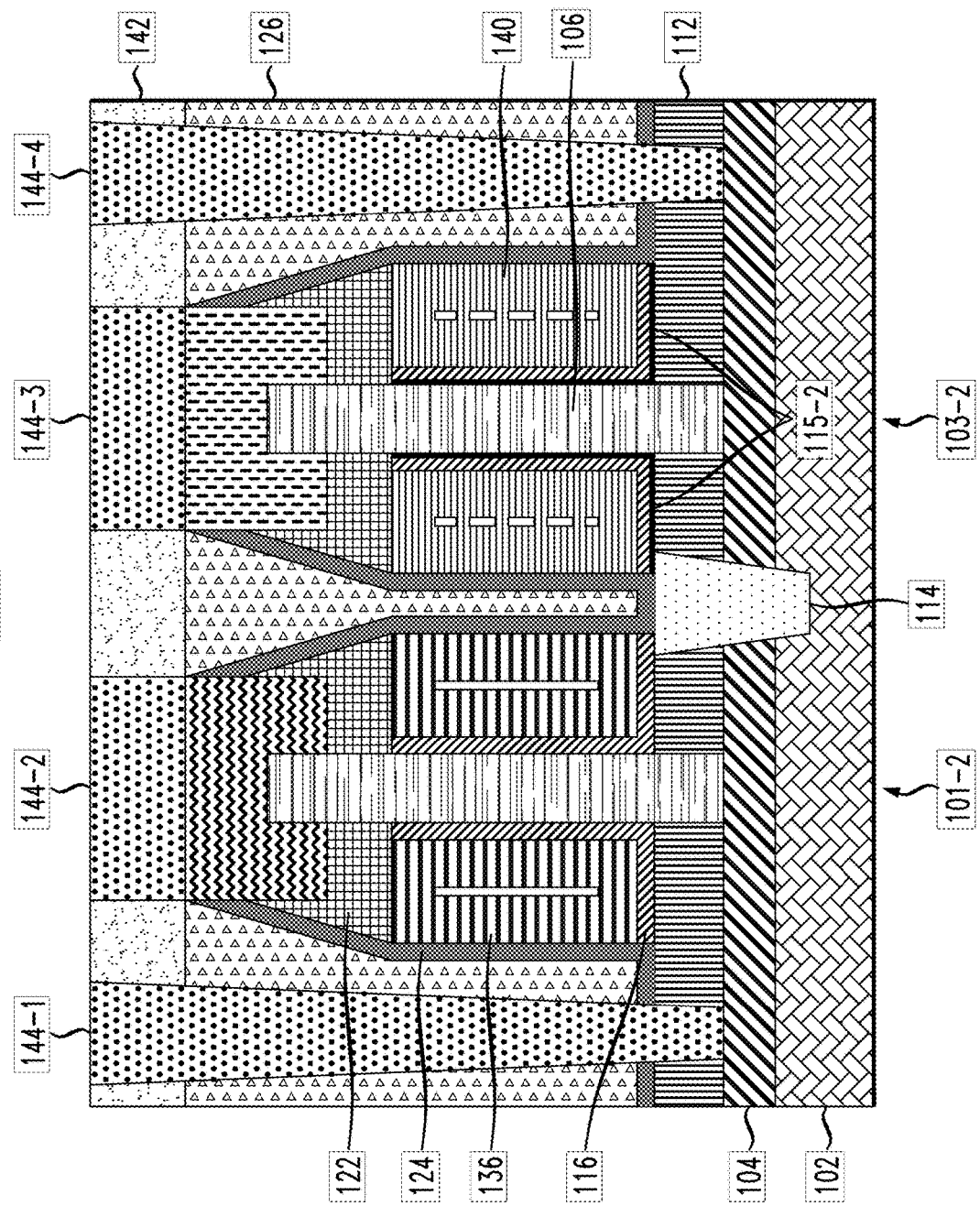
FIG. 16B depicts a second cross-sectional view across a second set of fins of a structure having second threshold voltages through the use of the metal oxide surrounding a second one of the fins, according to an embodiment of the invention.

FIG. 16B shows a second cross-sectional view 1650 across a second set of fins 106 of a structure. The FIG. 16B structure is similar to the structure shown in FIGS. 13A-13C and FIG. 16A, though a metal oxide layer 115-2 is formed surrounding the fin 106 for pFET 103-2. The metal oxide layer 115-2 may be formed of similar materials, with similar sizing and similar processing as that described above with respect to metal oxide 115-1.

The first set of fins of the FIG. 16A structure and the second set of fins of the FIG. 16B structure may be formed on a common wafer or substrate 102. The nFET 101-1 of FIG. 16A has a first Vt ($Vt1_{nFET}$) while the nFET 101-2 of FIG. 16B has a second Vt ($Vt2_{nFET}$). The difference between $Vt1_{nFET}$ and $Vt2_{nFET}$ in FIGS. 16A and 16B results from the presence and absence, respectively, of the metal oxide layer 115-1. Similarly, the pFET 103-1 of FIG. 16A has a first Vt ($Vt1_{pFET}$), while the pFET 103-2 of FIG. 16B has a second Vt ($Vt2_{pFET}$). The difference between $Vt1_{pFET}$ and $Vt2_{pFET}$ in FIGS. 16A and 16B results from the absence and presence, respectively, of the metal oxide layer 115-2.

Figure 17:
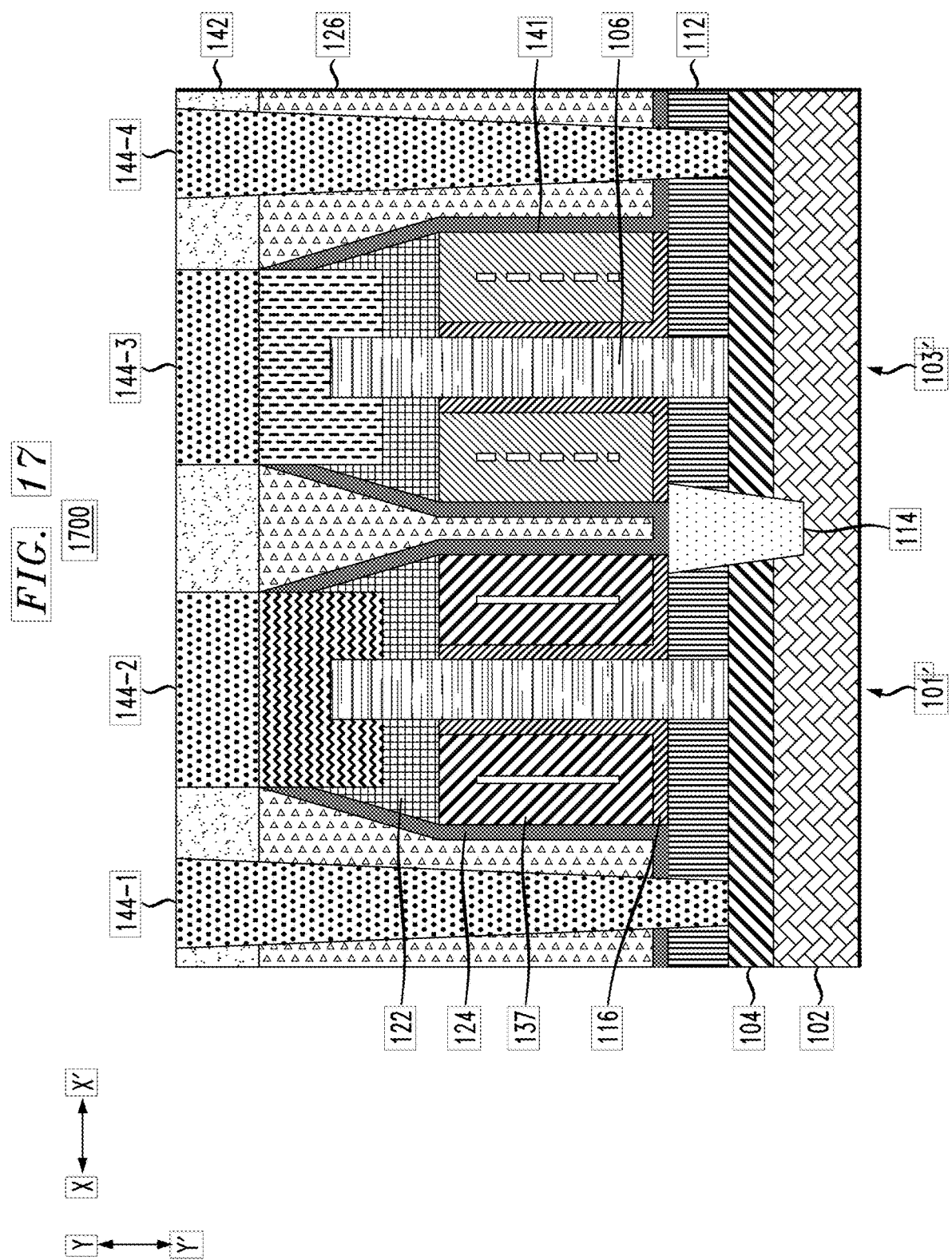
FIG. 17 depicts a cross-sectional view across a set of fins of a structure having different threshold voltages relative to the structure of FIG. 13A through the use of different gate conductor materials, according to an embodiment of the present invention.

In other embodiments, multi-Vt is achieved through forming gate conductors of different materials/stack for each device individually. For example, the structure shown in FIGS. 13A-13C may be considered as a first set of fins of a wafer that are formed with first nFET 101 and first pFET 103 using first nFET and first pFET gate conductor materials 136 and 140, respectively. FIG. 17 depicts a cross-sectional view across another set of fins (assumed to be on the same wafer or substrate 102 as the first set of fins shown in FIGS. 13A-13C), but where different nFET and pFET gate conductor materials 137 and 141 are used for second nFET 101' and second pFET 103', respectively. The nFET gate conductor material 137 is different than the nFET gate conductor material 136, and the pFET gate conductor material 141 is different than the pFET gate conductor material 140.

This may be achieved by patterning hard masks to pull the dummy gate 120 surrounding the fins 106 for the first nFET 101 and the second nFET 101' individually, such that the different nFET gate conductor materials 136 and 137 may be formed for the first nFET 101 and the second nFET 101'. For example, the first nFET gate conductor material 136 for the first nFET 101 may be deposited while the second nFET 101' and first and second pFETs 103 and 103' are protected by a mask, and the second nFET gate conductor material 137 for the second nFET 101' may be deposited while the first nFET 101 and first and second pFETs 103 and 103' are protected by a mask. Similar processing may be utilized to individually form the pFET gate conductor materials 140 and 141 for the first and second pFETs 103 and 103'. It should be appreciated that the order of forming the nFET gate conductor materials 136 and 137 and the pFET gate conductor materials 140 and 141 may vary as desired.

The first nFET 101 of FIGS. 13A-13C has a first Vt ($Vt1_{nFET}$), while the second nFET 101' of FIG. 17 has a second Vt ($Vt2_{nFET}$). The difference between $Vt1_{nFET}$ and $Vt2_{nFET}$ in FIGS. 13A-13C and 17 results from the differing materials (or different thickness of the same material or materials) used for the nFET gate conductor 136 for the first nFET 101 and nFET gate conductor 137 for the second nFET 101'. Similarly, the first pFET 103 of FIGS. 13A-13C has a first Vt ($Vt1_{pFET}$), while the second pFET 103' of FIG. 17 has a second Vt ($Vt2_{pFET}$). The difference between $Vt1_{pFET}$ and $Vt2_{pFET}$ in FIGS. 13A-13C and 17 results from the differing materials (or different thickness of the same material or materials) used for the pFET gate conductor 140 for the first pFET 103 and the pFET gate conductor 141 for the second pFET 103'.

In still other embodiments, multi-Vt is achieved through utilizing different gate conductor materials or WFMs for nFETs 101-1 and 101-2, and using a same gate conductor or WFM material for pFETs 103-1 and 103-2, but with and without the capping layer 118.

Figure 18A:
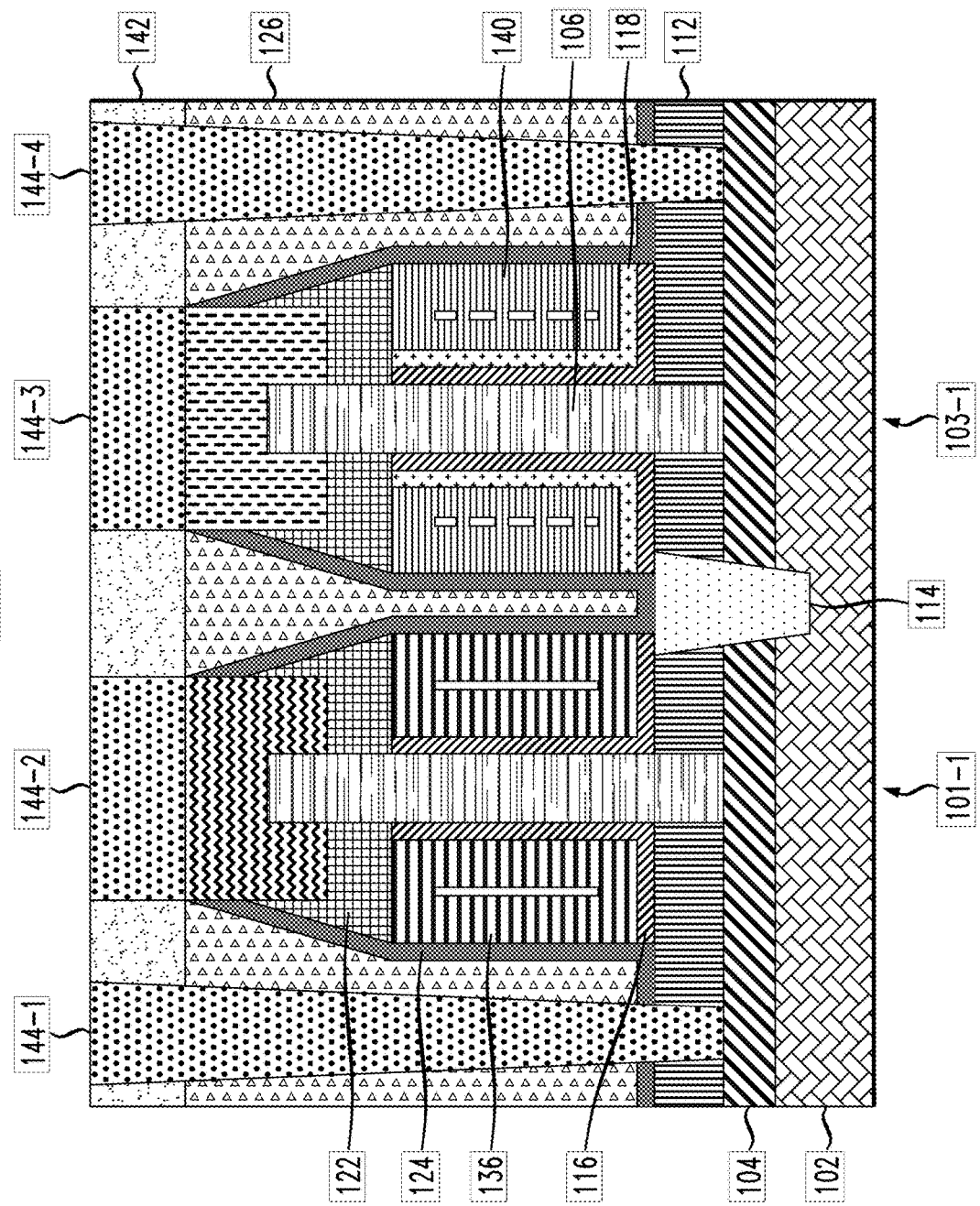
FIG. 18A depicts a cross-sectional view across a first set of fins of a structure having first threshold voltages through the use of a first gate conductor material surrounding a first one of the fins and removal of the capping layer surrounding a second one of the fins using a second gate conductor material, according to an embodiment of the invention.

FIG. 18A shows a first cross-sectional view 1800 across a first set of fins 106 of a structure. The FIG. 18A structure is similar to the structure shown in FIGS. 13A-13C, though for the pFET 103-1 the capping layer 118 is not removed with the dummy gate 120 such that the capping layer 118 remains disposed between the gate dielectric 116 and the pFET gate conductor 140.

Figure 18B:
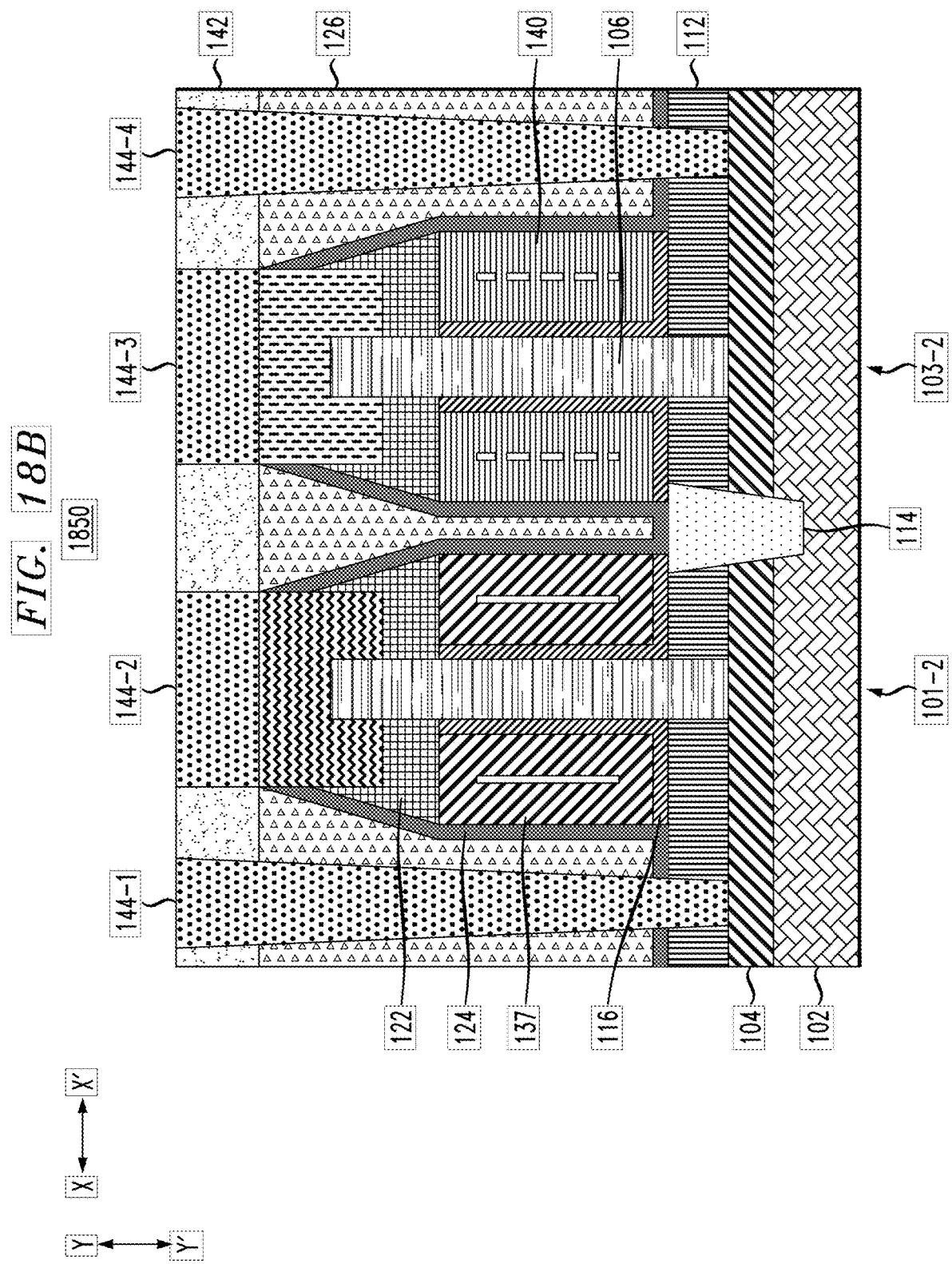
FIG. 18B depicts a cross-sectional view across a second set of fins of a structure having second threshold voltages through the use of a third gate conductor material surrounding the first fin and keeping the capping layer surrounding the second fin with the second gate conductor material, according to an embodiment of the invention.

FIG. 18B shows a second cross-sectional view 1850 across a second set of fins 106 of a structure. The FIG. 18B structure is similar to the structure shown in FIGS. 13A-13C and FIG. 18A, though a different nFET gate conductor or WFM 141 is used for nFET 101-2. The pFET 103-2 utilizes the same pFET gate conductor 140 as pFET 103-1, though the capping layer 118 is removed during the dummy gate 120 pull for pFET 103-2 as illustrated.

The nFET 101-1 of FIG. 18A has a first Vt ($Vt1_{nFET}$), while the nFET 101-2 of FIG. 18B has a second Vt ($Vt2_{nFET}$). The difference between $Vt1_{nFET}$ and $Vt2_{nFET}$ in FIGS. 18A and 18B results from the differing materials (or different thicknesses of the same material or materials) used for the nFET gate conductor 136 for nFET 101-1 and nFET gate conductor 137 for nFET 101-2. Similarly, the pFET 103-1 of FIG. 18A has a first Vt ($Vt1_{pFET}$), while the pFET 103-2 of FIG. 18B has a second Vt ($Vt2_{pFET}$). The difference between $Vt1_{pFET}$ and $Vt2_{pFET}$ in FIGS. 18A and 18B results from the presence and absence, respectively, of the capping layer 118 disposed between the gate dielectric 116 and the pFET gate conductor 140.

It should be appreciated that, in some embodiments, combinations of the above techniques may be used for forming nFETs and/or pFETs with different Vts.

In some embodiments, a method of forming a semiconductor structure comprises forming a plurality of fins over a top surface of a bottom source/drain region disposed over a top surface of a substrate, the fins providing vertical transport channels for a plurality of VTFETs. The method also comprises forming a first gate conductor surrounding a first one of an adjacent pair of the plurality of fins providing a first vertical transport channel for a first VTFET, forming a second gate conductor surrounding a second one of the adjacent pair of the plurality of fins providing a second vertical transport channel for a second VTFET, and forming at least one shared gate contact to the first gate conductor and the second gate conductor, the at least one shared gate contact being formed at first ends of the adjacent pair of the plurality of fins.

The method may further comprise forming a third gate conductor surrounding a first one of an additional adjacent pair of the plurality of fins providing a third vertical transport channel for a third VTFET, forming a fourth gate conductor surrounding a second one of the additional adjacent pair of the plurality of fins providing a fourth vertical transport channel for a fourth VTFET, and forming at least one additional shared gate contact to the third gate conductor and the fourth gate conductor, the at least one additional shared gate contact being formed at first ends of the additional adjacent pair of the plurality of fins. The first VTFET and the third VTFET may comprise respective n-type VTFETs, and the second VTFET and the fourth VTFET may comprise respective p-type VTFETs. The first and second VTFETs may have first threshold voltages associated therewith, and the third and fourth VTFETs may have second threshold voltages different than the first threshold voltages associated therewith.

Individual RMG processes may be utilized to form the first, second, third and fourth gate conductors. A given one of the RMG processes may comprise patterning a mask to expose a portion of a sacrificial material formed at a first end of a given one of the first, second, third and fourth fins while covering the sacrificial material formed at ends of the other ones of the first, second, third and fourth fins, removing laterally the sacrificial material surrounding the given fin and at the first end of the given fin, and depositing a given one of the first, second, third and fourth gate conductors surrounding the given fin and at the first end of the given fin.

In the given RMG process, a portion of the given gate conductor deposited at the first end of the given fin may be wider than a portion of the given gate conductor deposited surrounding the given fin. Depositing the given gate conductor may comprise utilizing a layer-by-layer ALD process.

The given RMG process may comprise patterning the mask to expose portions of the sacrificial material formed at the first end and second end of the given fin while covering the sacrificial material formed at ends of the other ones of the first, second, third and fourth fins, removing the sacrificial material surrounding the given fin from the first and second ends of the given fin, and depositing the given gate conductor surrounding the given fin and at the first and second ends of the given fin. The method may further comprise forming at least one additional shared gate contact to the first gate conductor and the second gate conductor, the at least one additional shared gate contact being formed at the second ends of the adjacent pair of the plurality of fins.

The first gate conductor and the third gate conductor may comprise a first material, and the second gate conductor and the fourth gate conductor may comprise a second material different than the first material. The first fin providing the first vertical transport channel for the first VTFET may comprise a first metal oxide layer formed between sidewalls of the first fin and a gate dielectric surrounding the first fin, and the fourth fin providing the fourth vertical transport channel for the fourth VTFET may comprise a second metal oxide layer formed between sidewalls of the fourth fin and the gate dielectric surrounding the fourth fin.

The first gate conductor and the third gate conductor may comprise at least one of different materials and different stacks of materials, and the second gate conductor and the fourth gate conductor may comprise at least one of different materials and different stacks of materials. The first gate conductor and the third gate conductor may comprise respective different n-type WFM materials, and the second gate conductor and the fourth gate conductor may comprise respective different p-type WFM materials.

The first gate conductor and the third gate conductor may comprise at least one of different materials and different stacks of materials, and the second gate conductor and the fourth gate conductor may be formed of a same material. The second fin providing the second vertical transport channel for the second VTFET may comprise a capping layer formed between a gate dielectric surrounding sidewalls of the second fin and the second gate conductor, and the fourth fin providing the fourth vertical transport channel for the fourth VTFET may not comprise the capping layer formed between the gate dielectric surrounding sidewalls of the fourth fin and the fourth gate conductor.

In some embodiments, a semiconductor structure comprises a substrate, a bottom source/drain region disposed on a top surface of the substrate, a plurality of fins disposed over a top surface of the bottom source/drain region, the fins providing vertical transport channels for one or more VTFETs, a first gate conductor disposed surrounding a first one of an adjacent pair of the plurality of fins providing a first vertical transport channel for a first VTFET, a second gate conductor disposed surrounding a second one of the adjacent pair of the plurality of fins providing a second vertical transport channel for a second VTFET, and at least one shared gate contact to the first gate conductor and the second gate conductor, the at least one shared gate contact being disposed at first ends of the adjacent pair of the plurality of fins.

The semiconductor structure may further comprise a third gate conductor disposed surrounding a first one of an additional adjacent pair of the plurality of fins providing a third vertical transport channel for a third VTFET, a fourth gate conductor disposed surrounding a second one of the additional adjacent pair of the plurality of fins providing a fourth vertical transport channel for a fourth VTFET, and at least one additional shared gate contact to the third gate conductor and the fourth gate conductor, the at least one additional shared gate contact being disposed at first ends of the additional adjacent pair of the plurality of fins. The first and third VTFETs may comprise respective n-type VTFETs, and the second and fourth VTFETs may comprise respective p-type VTFETs. The first and second VTFETs may have first threshold voltages associated therewith, and the third and fourth VTFETs may have second threshold voltages different than the first threshold voltages associated therewith.

The first, second, third and fourth gate conductors may each be disposed at first ends of respective ones of the first, second, third and fourth fins by individual RMG processes.

The first gate conductor and the third gate conductor may comprise a first material, and the second gate conductor and the fourth gate conductor may comprise a second material different than the first material. The first fin providing the first vertical transport channel for the first VTFET may comprise a first metal oxide layer disposed between sidewalls of the first fin and a gate dielectric surrounding the first fin, and the fourth fin providing the fourth vertical transport channel for the fourth VTFET may comprise a second metal oxide layer disposed between sidewalls of the fourth fin and the gate dielectric surrounding the fourth fin.

The first gate conductor and the third gate conductor may comprise at least one of different materials and different stacks of materials, and the second gate conductor and the fourth gate conductor may comprise at least one of different materials and different stacks of materials. The first gate conductor and the third gate conductor may comprise respective different n-type WFM materials, and the second gate conductor and the fourth gate conductor may comprise respective different p-type WFM materials.

The first gate conductor and the third gate conductor may comprise at least one of different materials and different stacks of materials, and the second gate conductor and the fourth gate conductor may comprise a same material. The second fin providing the second vertical transport channel for the second VTFET may comprise a capping layer disposed between a gate dielectric surrounding sidewalls of the second fin and the second gate conductor, and the fourth fin providing the fourth vertical transport channel for the fourth VTFET may not comprise the capping layer disposed between the gate dielectric surrounding sidewalls of the fourth fin and the fourth gate conductor.

In some embodiments, integrated circuits comprise one or more of the above-described semiconductor structures.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a plurality of fins over a top surface of a bottom source/drain region disposed over a top surface of a substrate, the fins providing vertical transport channels for a plurality of vertical transport field-effect transistors;
    forming a first gate conductor surrounding a first one of an adjacent pair of the plurality of fins providing a first vertical transport channel for a first vertical transport field-effect transistor;
    forming a second gate conductor surrounding a second one of the adjacent pair of the plurality of fins providing a second vertical transport channel for a second vertical transport field-effect transistor;

forming at least one shared gate contact to the first gate conductor and the second gate conductor, the at least one shared gate contact being formed at first ends of the adjacent pair of the plurality of fins;

forming a third gate conductor surrounding a first one of an additional adjacent pair of the plurality of fins providing a third vertical transport channel for a third vertical transport field-effect transistor;

forming a fourth gate conductor surrounding a second one of the additional adjacent pair of the plurality of fins providing a fourth vertical transport channel for a fourth vertical transport field-effect transistor; and forming at least one additional shared gate contact to the third gate conductor and the fourth gate conductor, the at least one additional shared gate contact being formed at first ends of the additional adjacent pair of the plurality of fins;

wherein the first vertical transport field-effect transistor and the third vertical transport field-effect transistor comprise respective n-type vertical transport field-effect transistors;

wherein the second vertical transport field-effect transistor and the fourth vertical transport field-effect transistor comprise respective p-type vertical transport field-effect transistors;

wherein the first vertical transport field-effect transistor and the second vertical transport field-effect transistor have first threshold voltages associated therewith; and wherein the third vertical transport field-effect transistor and the fourth vertical transport field-effect transistor have second threshold voltages different than the first threshold voltages associated therewith.

2. The method of claim 1, wherein individual replacement metal gate processes are utilized to form the first, second, third and fourth gate conductors, a given one of the replacement metal gate processes comprising:

patterning a mask to expose a portion of a sacrificial material formed at a first end of a given one of the first, second, third and fourth fins while covering the sacrificial material formed at ends of the other ones of the first, second, third and fourth fins;

removing laterally the sacrificial material surrounding the given fin and at the first end of the given fin; and depositing a given one of the first, second, third and fourth gate conductors surrounding the given fin and at the first end of the given fin.

3. The method of claim 2, wherein the given replacement metal gate process comprises:

patterning the mask to expose portions of the sacrificial material formed at the first end and second end of the given fin while covering the sacrificial material formed at ends of the other ones of the first, second, third and fourth fins;

removing the sacrificial material surrounding the given fin from the first and second ends of the given fin; and depositing the given gate conductor surrounding the given fin and at the first and second ends of the given fin.

4. The method of claim 3, further comprising forming at least one additional shared gate contact to the first gate conductor and the second gate conductor, the at least one additional shared gate contact being formed at the second ends of the adjacent pair of the plurality of fins.

5. The method of claim 2, wherein a portion of the given gate conductor deposited at the first end of the given fin is wider than a portion of the given gate conductor deposited surrounding the given fin.

6. The method of claim 2, wherein depositing the given gate conductor comprises utilizing a layer-by-layer atomic layer deposition process.

7. The method of claim 2, wherein:

the first gate conductor and the third gate conductor comprise a first material;

the second gate conductor and the fourth gate conductor comprise a second material different than the first material;

the first fin providing the first vertical transport channel for the first vertical transport field-effect transistor comprises a first metal oxide layer formed between sidewalls of the first fin and a gate dielectric surrounding the first fin; and the fourth fin providing the fourth vertical transport channel for the fourth vertical transport field-effect transistor comprises a second metal oxide layer formed between sidewalls of the fourth fin and the gate dielectric surrounding the fourth fin.

8. The method of claim 2, wherein the first gate conductor and the third gate conductor comprise at least one of different materials and different stacks of materials, and wherein the second gate conductor and the fourth gate conductor comprise at least one of different materials and different stacks of materials.

9. The method of claim 8, wherein the first gate conductor and the third gate conductor comprise respective different n-type work function metal materials, and wherein the second gate conductor and the fourth gate conductor comprise respective different p-type work function metal materials.

10. The method of claim 2, wherein:

the first gate conductor and the third gate conductor comprise at least one of different materials and different stacks of materials;

the second gate conductor and the fourth gate conductor are formed of a same material;

the second fin providing the second vertical transport channel for the second vertical transport field-effect transistor comprises a capping layer formed between a gate dielectric surrounding sidewalls of the second fin and the second gate conductor; and the fourth fin providing the fourth vertical transport channel for the fourth vertical transport field-effect transistor does not comprise the capping layer formed between the gate dielectric surrounding sidewalls of the fourth fin and the fourth gate conductor.

* * * * *